(12) United States Patent
Matsuzawa et al.

(10) Patent No.: US 11,664,296 B2
(45) Date of Patent: May 30, 2023

(54) SEMICONDUCTOR MODULE AND VEHICLE

(71) Applicant: FUJI ELECTRIC CO., LTD., Kanagawa (JP)

(72) Inventors: Kensuke Matsuzawa, Matsumoto (JP); Takahiro Koyama, Matsumoto (JP); Hiromichi Gohara, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 288 days.

(21) Appl. No.: 17/183,389

(22) Filed: Feb. 24, 2021

(65) Prior Publication Data
US 2021/0313249 A1 Oct. 7, 2021

(30) Foreign Application Priority Data
Apr. 2, 2020 (JP) .............................. JP2020-067089

(51) Int. Cl.
*H01L 23/473* (2006.01)
*H01L 23/40* (2006.01)
(52) U.S. Cl.
CPC ........ *H01L 23/473* (2013.01); *H01L 23/4006* (2013.01); *H01L 2023/4043* (2013.01); *H01L 2023/4087* (2013.01)
(58) Field of Classification Search
None
See application file for complete search history.

(56) References Cited

U.S. PATENT DOCUMENTS

| 8,616,267 | B2 * | 12/2013 | Capriz | ................. | H01L 23/473 |
|---|---|---|---|---|---|
| | | | | | 165/80.4 |
| 10,510,640 | B2 | 12/2019 | Kobayashi | | |
| 2007/0076374 | A1 * | 4/2007 | Mongia | ................. | H01L 23/473 |
| | | | | | 257/E23.098 |
| 2016/0358864 | A1 | 12/2016 | Kato | | |
| 2017/0263533 | A1 | 9/2017 | Koyama | | |
| 2019/0363036 | A1 | 11/2019 | Arai | | |
| 2020/0051892 | A1 | 2/2020 | Gohara | | |

FOREIGN PATENT DOCUMENTS

| EP | 3745453 A1 | 12/2020 |
|---|---|---|
| JP | 2016100456 A | 5/2016 |
| JP | 2017098439 A | 6/2017 |
| JP | 2017183421 A | 10/2017 |

(Continued)

*Primary Examiner* — Evren Seven

(57) ABSTRACT

Provided is a semiconductor module including semiconductor devices and a cooling apparatus, wherein the semiconductor device has semiconductor chips and a circuit board with the semiconductor chips implemented thereon; the cooling apparatus has a top plate, a side wall, a bottom plate, a coolant flow portion, an inlet, an outlet and a plurality of fins; the top plate and the bottom plate have three through holes that are through holes for inserting fastening members that fasten the semiconductor module to an external apparatus, penetrating the top plate and the bottom plate in one direction respectively; and a geometric center of gravity of a aperture of at least one of the inlet and the outlet may also be positioned inside a virtual triangle with the three through holes being vertexes in planar view.

20 Claims, 13 Drawing Sheets

(56) References Cited

FOREIGN PATENT DOCUMENTS

| | | |
|---|---|---|
| JP | 6486579 B1 | 3/2019 |
| JP | 2019129208 A | 8/2019 |
| JP | 2019204922 A | 11/2019 |
| JP | 2020027891 A | 2/2020 |
| WO | 2016042903 A1 | 3/2016 |
| WO | 2016121159 A1 | 8/2016 |
| WO | 2016204257 A1 | 12/2016 |

* cited by examiner

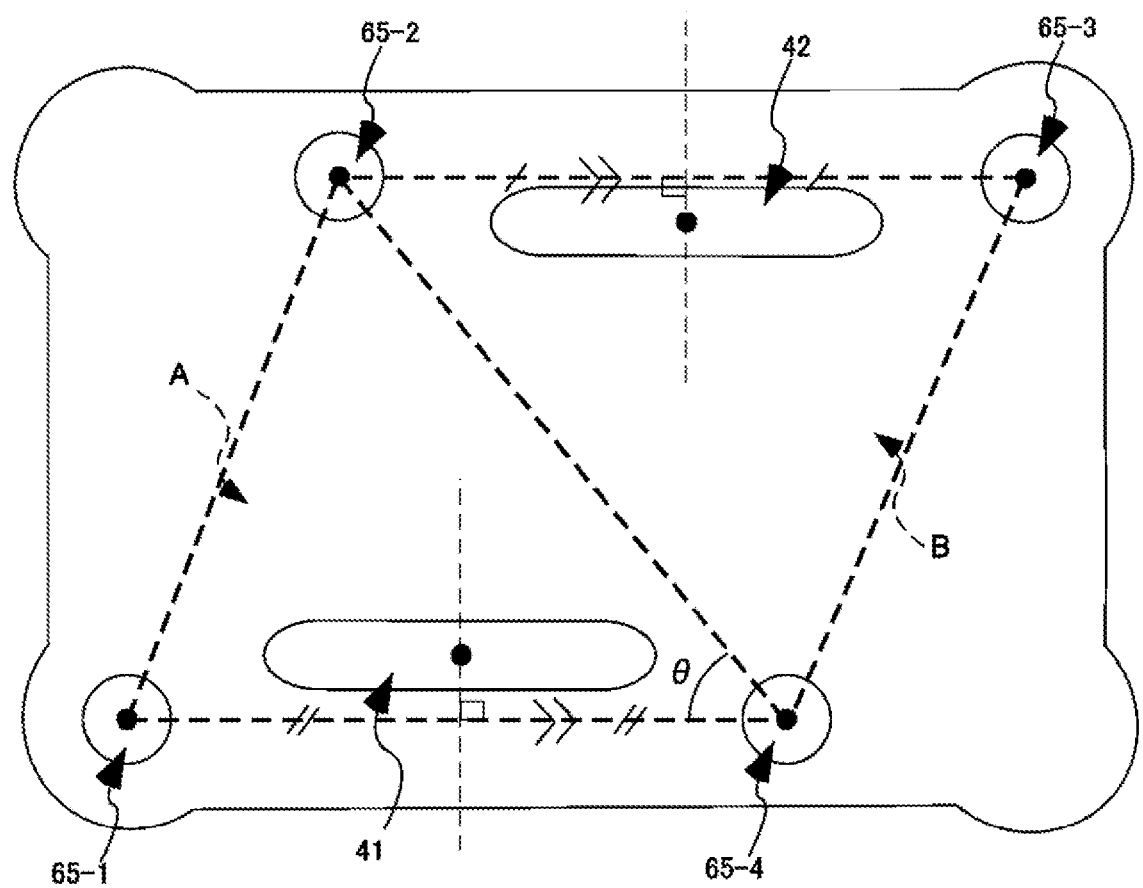
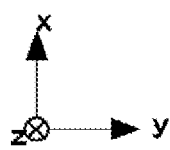
FIG. 11

SEMICONDUCTOR MODULE AND VEHICLE

The contents of the following Japanese patent application are incorporated herein by reference:
NO. 2020-067089 filed in JP on Apr. 2, 2020

BACKGROUND

1. Technical Field

The present invention relates to a semiconductor module and a vehicle.

2. Related Art

Conventionally, a semiconductor module, in which a cooler including cooling fins is implemented, including a plurality of semiconductor devices such as power semiconductor chips is known (see Patent Document 1-11 for example).

PRIOR ART DOCUMENT

Patent Document

Patent Document 1: Japanese Patent Application Publication No. 2019-129208
Patent Document 2: Patent No. WO 2016/121159
Patent Document 3: Japanese Patent Application Publication No. 2020-027891
Patent Document 4: Japanese Patent Application Publication No. 2019-204922
Patent Document 5: Japanese Patent No. 6486579
Patent Document 6: Japanese Patent Application Publication No. 2020-027891
Patent Document 7: Patent No. WO 2016/204257
Patent Document 8: Japanese Patent Application Publication No. 2017-183421
Patent Document 9: Japanese Patent Application Publication No. 2017-098439
Patent Document 10: Japanese Patent Application Publication No. 2016-100456
Patent Document 11: Patent No. WO 2016/042903

BRIEF DESCRIPTION OF THE DRAWINGS

FIG. 11 illustrates a schematic bottom view showing one example of a bottom plate 68, which is a modification example of the bottom plate 64 of the semiconductor module 100 according to one embodiment of the present invention.

DESCRIPTION OF EXEMPLARY EMBODIMENTS

Hereinafter, the present invention will be described through embodiments of the invention, but the following embodiments do not limit the invention according to the claims. Further, not all of the combinations of features described in the embodiments are essential to the solutions of the invention.

Figure 1:
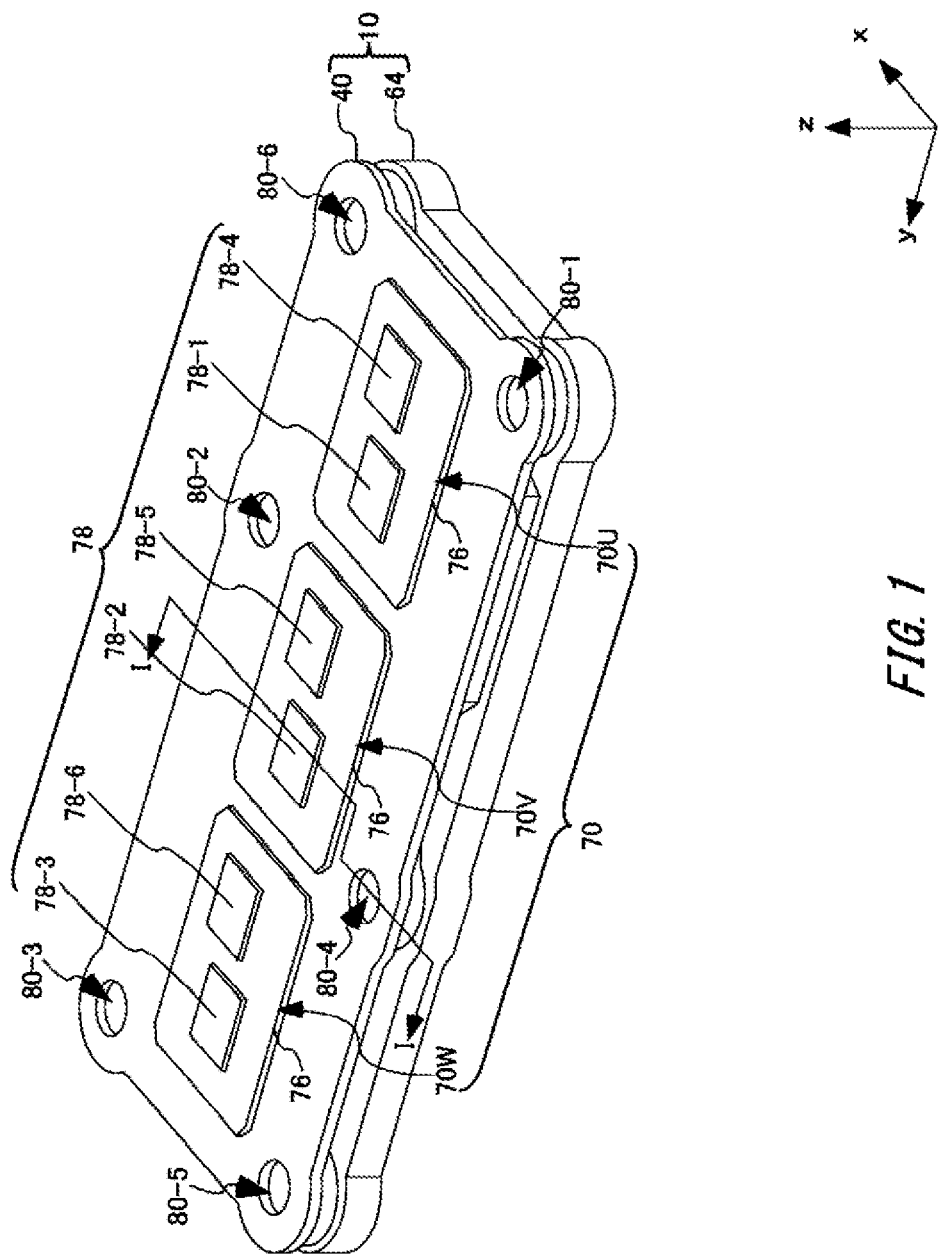
FIG. 1 illustrates a schematic perspective view showing one example of a semiconductor module 100 according to one embodiment of the present invention.
Figure 2:
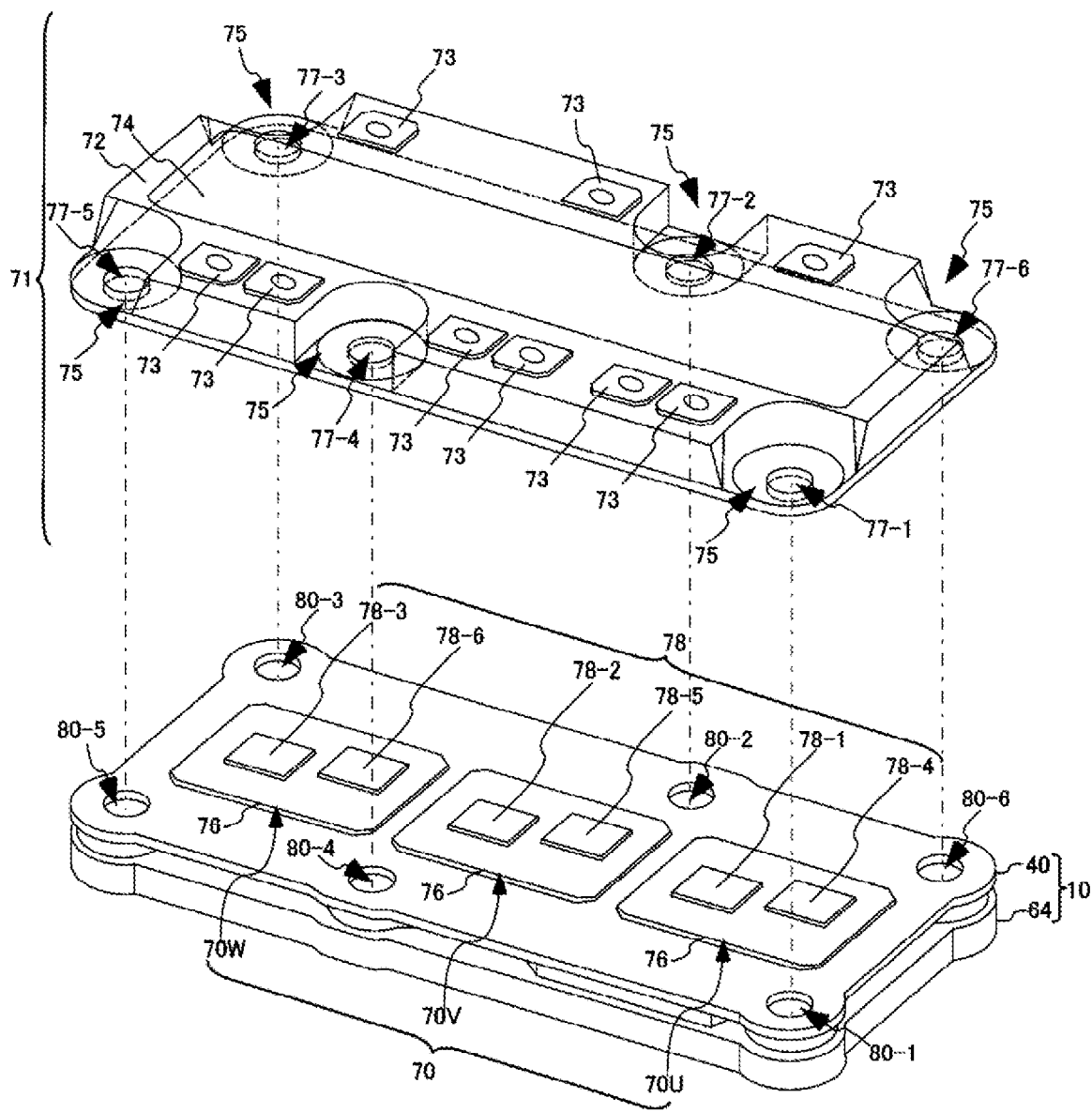
FIG. 2 illustrates a schematic perspective view showing one example of the semiconductor module 100 according to one embodiment of the present invention.
Figure 3:
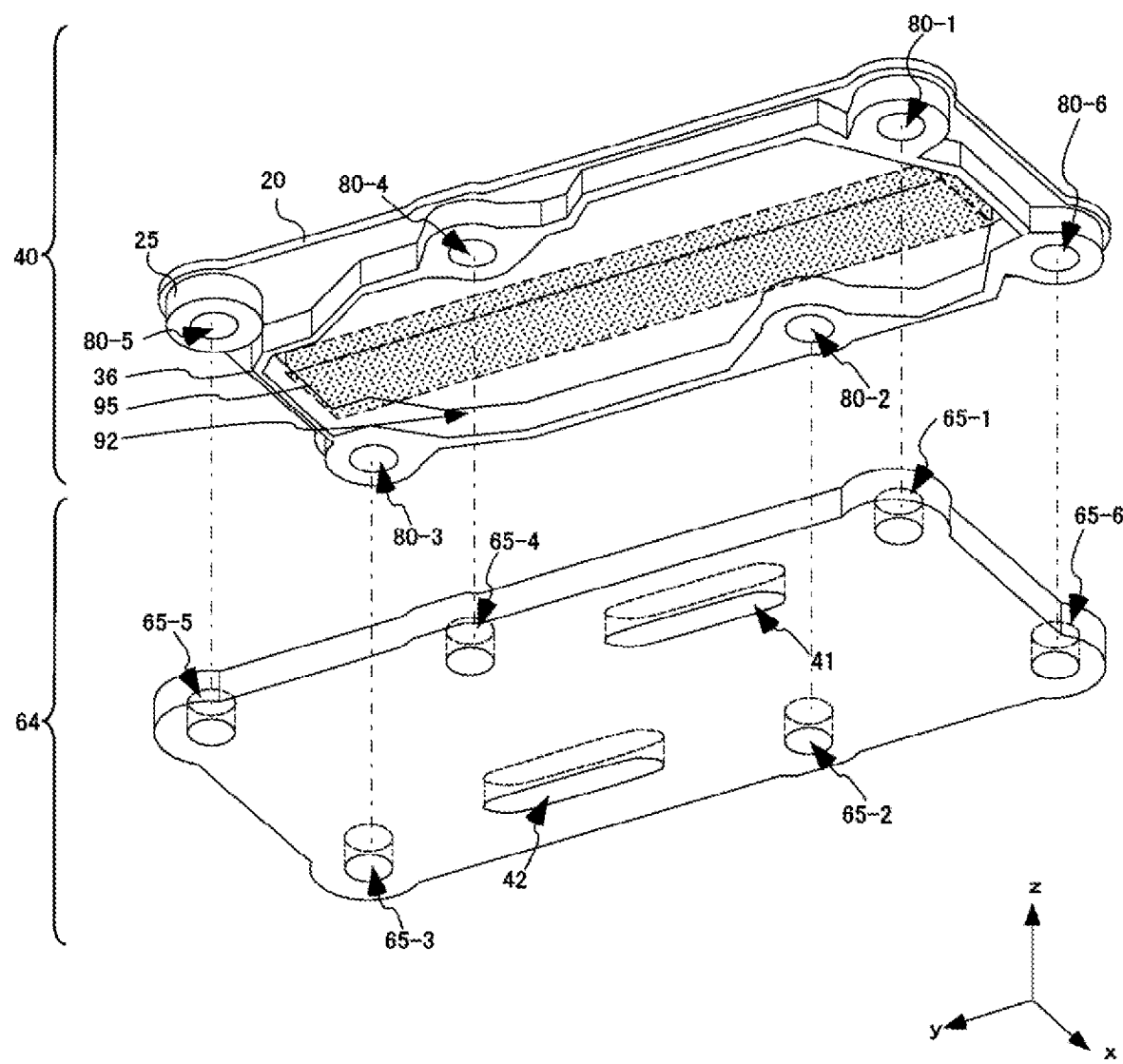
FIG. 3 illustrates a schematic perspective view showing one example of a cooling apparatus 10 of the semiconductor module 100 according to one embodiment of the present invention.
Figure 4:
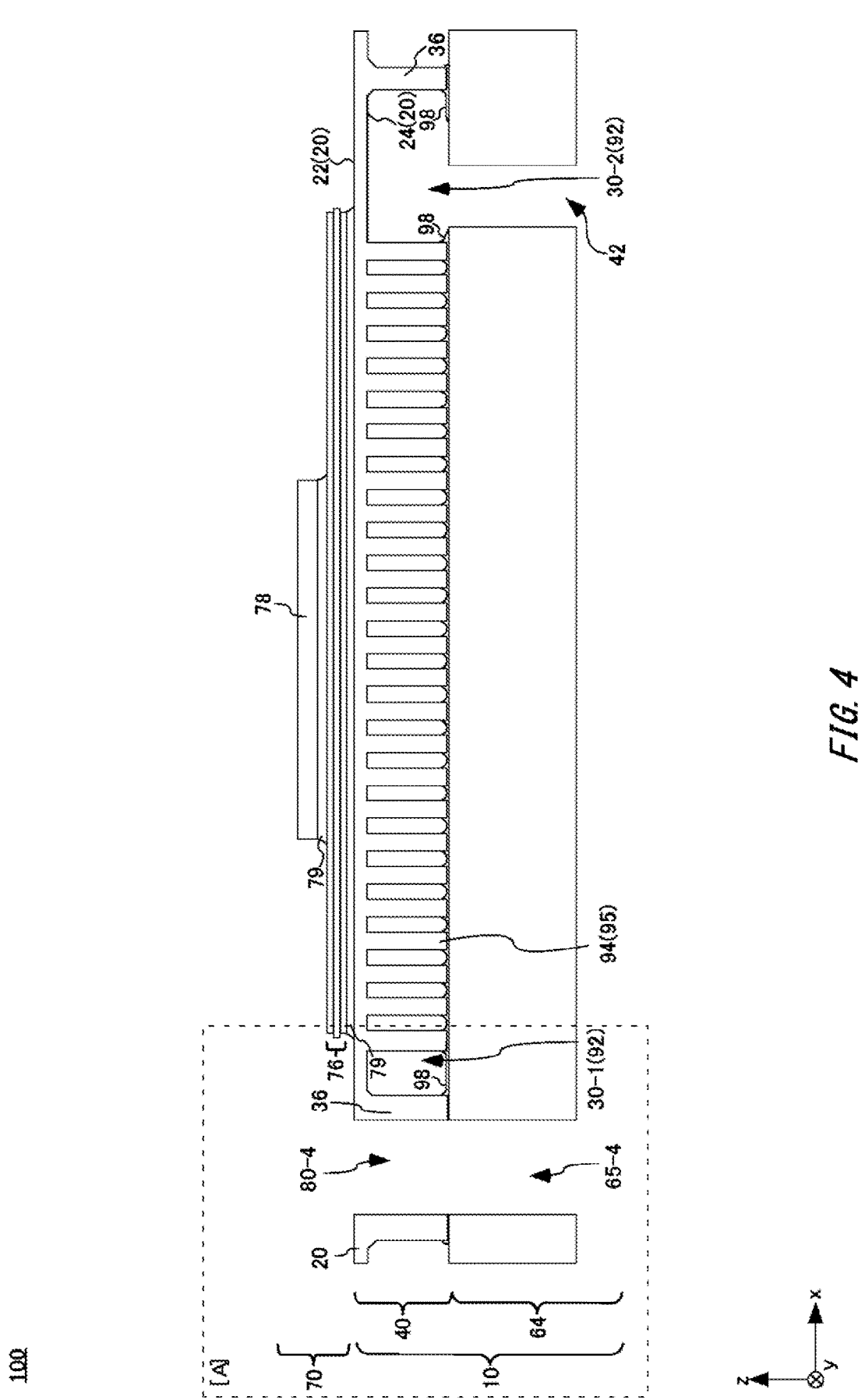
FIG. 4 illustrates a schematic cross sectional view of the semiconductor module 100 being virtually cut along the I-I line shown in FIG. 1.
Figure 5:
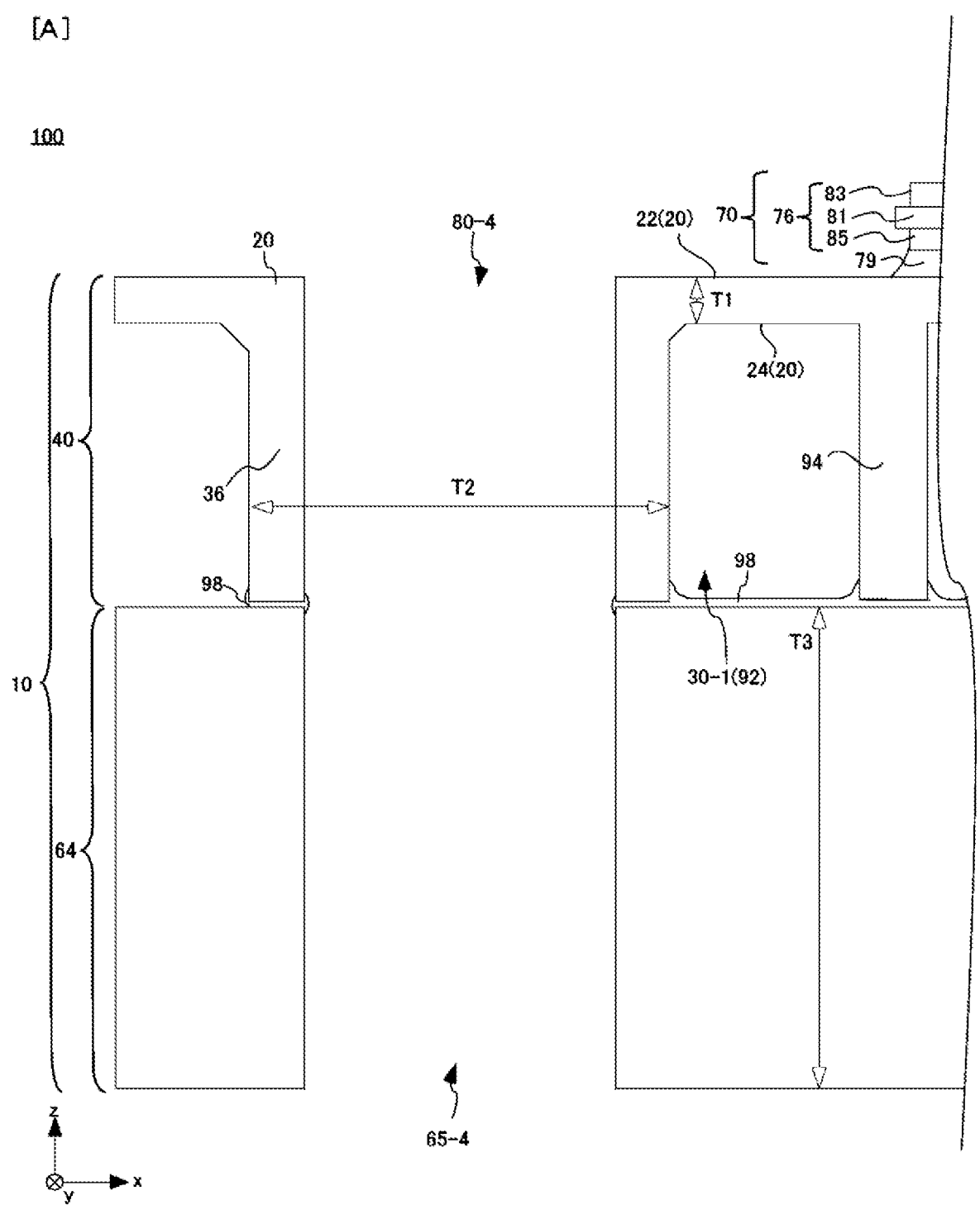
FIG. 5 illustrates a partially enlarged view of region [A] indicated by dashed lines in FIG. 4.
Figure 6:
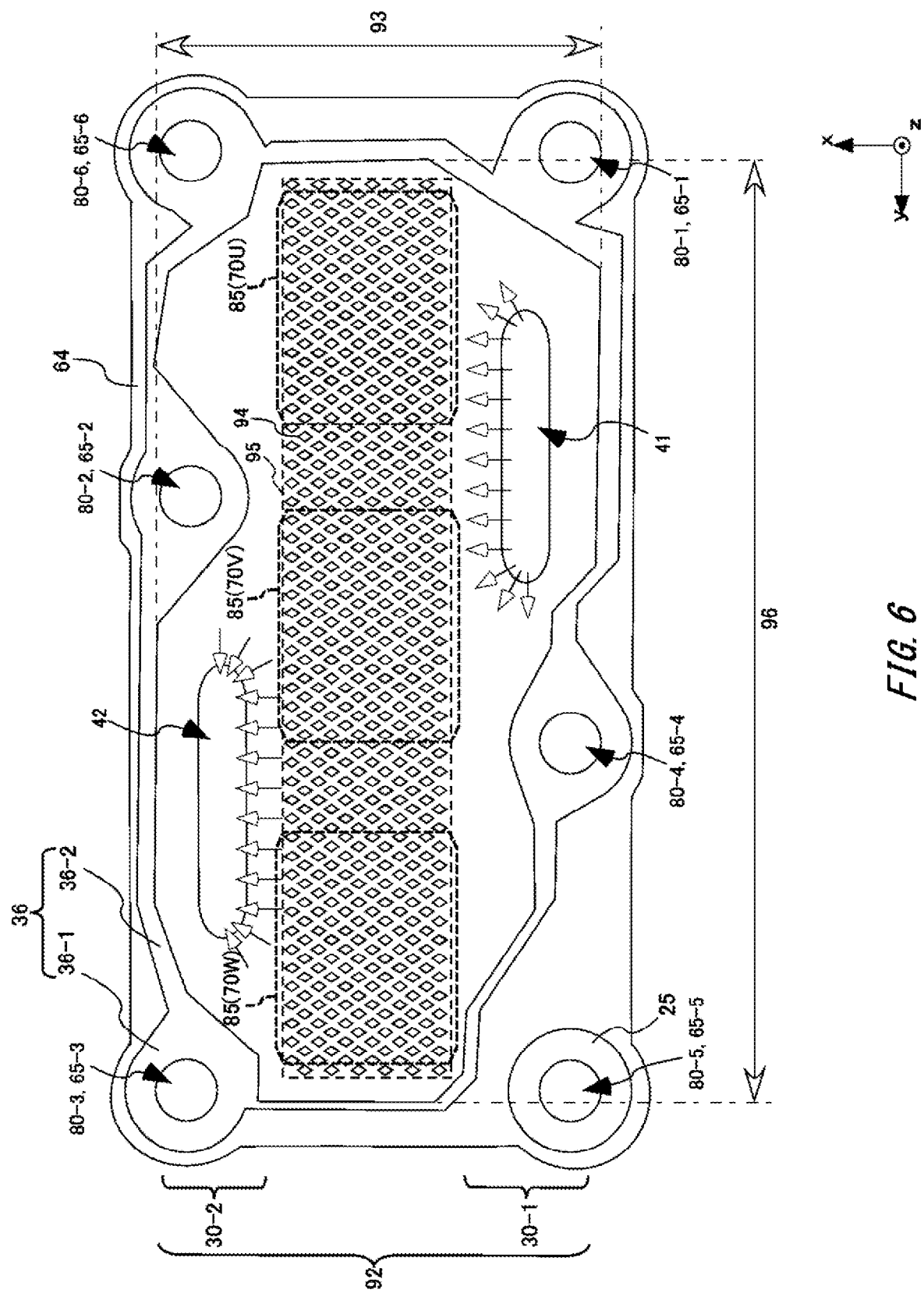
FIG. 6 illustrates one example of the arrangement and shape of a side wall 36 and a reinforcing portion 25, the arrangement of a cooling region 95 of the cooling apparatus 10, the arrangement of a metal layer 85 of the semiconductor device 70, the arrangement and shape of fins 94, and the flow direction of the coolant in the semiconductor module 100 according to one embodiment of the present invention.

FIG. 1 and FIG. 2 illustrate a schematic perspective view showing one example of the semiconductor module 100 according to one embodiment of the present invention, and FIG. 3 illustrates a schematic perspective view showing one example of the cooling apparatus 10 of the semiconductor module 100 according to one embodiment of the present invention. In addition, FIG. 4 illustrates a schematic cross sectional view of the semiconductor module 100 being virtually cut along the I-I line shown in FIG. 1, and FIG. 5 illustrates a partially enlarged view of region [A] indicated by dashed lines in FIG. 4. In addition, FIG. 6 illustrates one example of the arrangement and shape of the side wall 36 and the reinforcing portion 25, the arrangement of a cooling region 95 of the cooling apparatus 10, the arrangement of a metal layer 85 of the semiconductor device 70, the arrangement and shape of fins 94, and the flow direction of the coolant in the semiconductor module 100 according to one embodiment of the present invention.

In FIG. 1, FIG. 4 and FIG. 5, the resin structure 71 shown in FIG. 2 is omitted from the illustration simply to clarify the description. In addition, in FIG. 5, on the top plate 20, the thickness in the z axis direction of a portion facing the coolant flow portion 92 is shown as T1, and the thickness in the x axis direction of the thick portion 36-2 of the side wall 36 is shown as T2, and the thickness in the z axis direction of the bottom plate 64 is shown as T3. In addition, in FIG. 6, the metal layers 85 of U phase unit 70U, V phase unit 70V and W phase unit 70W shown in FIG. 1 are indicated in dashed lines, respectively.

The semiconductor module 100 includes the semiconductor devices 70 and the cooling apparatus 10. The semiconductor devices 70 of this embodiment are placed on the cooling apparatus 10. In the description of this embodiment, the plane of the cooling apparatus 10 with the semiconductor devices 70 placed thereon is taken as the xy plane, and the axis perpendicular to the xy plane is taken as the z axis. The xyz axes form a right-handed system. In the description of this embodiment, the direction from the cooling apparatus 10 toward the semiconductor device 70 in the z axis direction is taken as up, and the opposite direction is taken as down, but the up and down directions are not limited to the gravity direction. And in the description of this embodiment, among the surfaces of each member, the surface on the upper side is taken as the upper surface, the surface on the lower side is taken as the lower surface, and the surface between the upper and lower surfaces is taken as the side surface. In the description of this embodiment, the planar view indicates the case of seeing the semiconductor module 100 from the positive direction or the negative direction of the z axis direction.

The semiconductor device 70 has semiconductor chips 78 and a circuit board 76 on which the semiconductor chips 78 are implemented. The semiconductor device 70 according to this embodiment includes three circuit boards 76, and the three circuit boards 76 are arranged in the y axis direction on the cooling apparatus 10. One or more semiconductor chips 78 may be loaded on each circuit board 76. In this embodiment, there are two semiconductor chips 78 loaded on each circuit board 76, and the two semiconductor chips 78 are arranged in the y axis direction on the circuit board 76. In addition, the semiconductor device 70 of this embodiment further has a resin structure 71 for sealing the semiconductor chips 78.

The semiconductor module 100 of this embodiment functions as an apparatus for configuring a three-phase AC inverter. As shown in FIG. 1, as power semiconductor devices, the semiconductor devices 70 of this embodiment includes a U phase unit 70U including a circuit board 76 and a semiconductor chip 78-1 and a semiconductor chip 78-4, a V phase unit 70V including a circuit board 76, a semiconductor chip 78-2 and a semiconductor chip 78-5, and a W phase unit 70W including a circuit board 76 and a semiconductor chip 78-3 and a semiconductor chip 78-6. In addition, each semiconductor chip 78 of the U phase unit 70U, the V phase unit 70V and the W phase unit 70W becomes a heat source for generating heat when the semiconductor module 100 operates.

The semiconductor chip 78 is a vertical semiconductor device, and has an upper-surface electrode and a lower surface electrode. The semiconductor chip 78, as one example, includes devices such as insulated gate bipolar transistors (IGBTs) formed on semiconductor substrates of silicon or the like, MOS field effect transistors (MOSFETs) and freewheeling diodes (FWDs) or the like. The semiconductor chip 78 may also be a reverse conducting IGBT (RC-IGBT) in which IGBT and FWD are formed on one semiconductor substrate. In the RC-IGBT, the IGBT and the FWD may be connected in reversely parallel to each other.

The lower surface electrode of the semiconductor chip 78 is connected to the upper surface of the circuit board 76. The semiconductor chip 78 of this embodiment is fixed on the upper surface of the circuit board 76 by a solder 79. The upper surface electrode of the semiconductor chip 78 may be an emitter, source or anode electrode, and the lower surface electrode may be a collector, drain or cathode electrode. The semiconductor substrate of the semiconductor chip 78 may also be silicon carbide (SiC) or gallium nitride (GaN).

The semiconductor chip 78 including switching devices such as IGBTs or MOSFETs has a control electrode. The semiconductor module 100 may also have a control terminal connected to the control electrode of the semiconductor chip 78. The switching device can be controlled by an external control circuit via the control terminal.

As shown in FIG. 5, the circuit board 76 is a laminated substrate sequentially including an insulating plate 81 with an upper surface and a lower surface, a circuit layer 83 provided on the upper surface of the insulating plate 81, and a metal layer 85 provided on the lower surface of the insulating plate 81.

The circuit board 76 has upper and lower surfaces, and the lower surface is arranged on the upper surface of the cooling apparatus 10. The circuit board 76 of this embodiment is fixed on the upper surface of the cooling apparatus 10, via the metal layers 85 by the solder 79. Also, on the upper surface of the circuit board 76 of this embodiment, as one example, two semiconductor chips 78 are fixed there.

The circuit board 76 may be, for example, a DCB (Direct Copper Bonding) substrate or an AMB (Active Metal Brazing) substrate. The insulating plate 81 of this embodiment includes ceramics. The insulating plate 81 may be formed using ceramic materials such as alumina ($Al_2O_3$), aluminum nitride (AlN) and silicon nitride ($Si_3N_4$). The insulating plate 81 of this embodiment is a rectangle in planar view.

In this specification, a rectangle may mean a quadrangle or a rectangle, or may be a shape with at least one corner chamfered or in a smooth shape. For example, a rectangle may also include an octagonal, a dodecagon, and a hexadecagon and so on in which the four corners are chamfered respectively.

The circuit layer 83 and the metal layers 85 may be boards including conductive materials such as copper or copper alloy. The circuit layer 83 and the metal layers 85 in this embodiment are rectangles in planar view, the same as the insulating plate 81.

The circuit layer 83 is fixed on the upper surface side of the insulating plate 81 by solder, brazing or the like. On the upper surface of the circuit layer 83, the semiconductor chip 78 is connected electrically and mechanically by solder and the like, that is, connected directly in an electrical circuit manner. In addition, the circuit layer 83 may also be connected electrically with the other conductive members by wires and the like. Also, the circuit layer 83 may also be directly bonded (DCB: Direct Copper Bonding) onto the upper surface of the insulating plate 81.

The resin structure 71 is a rectangle in planar view, and to be more specific, a rectangle with longer sides and shorter sides. As shown in FIG. 2, the resin structure 71 of this embodiment includes a sealing portion 74 for sealing the semiconductor chips 78, and an accommodating portion 72 for enclosing the sealing portion 74. The sealing portion 74 is an insulating member including resins such as, for example, silicone gel or epoxy resin. The sealing portion 74 of this embodiment also seals the circuit board 76 and the other circuit elements, in addition to the semiconductor chips 78.

The accommodating portion 72 is a frame body formed by insulating materials such as, for example, thermosetting resin, or ultraviolet curing resin. The accommodating portion 72 of this embodiment is provided enclosing the region on the upper surface 22 of the top plate 20, in which the circuit board 76 and so on is arranged. In other words, the accommodating portion 72 of this embodiment has an internal space that can accommodate the semiconductor chips 78, the circuit board 76 and the other circuit elements.

The accommodating portion 72 may also be bonded to the upper surface 22 of the top plate 20. The above-mentioned sealing portion 74 is formed by, as one example, filling and curing the resin mentioned above within the internal space of the accommodating portion 72. In addition, the resin structure 71 may also only include the sealing portion 74, without including the accommodating portion 72.

The accommodating portion 72 has a plurality of conductive connection portions 73 that are insert-molded. Each of the plurality of the conductive connection portions 73 has one end electrically connected to the semiconductor device 70, and the other end electrically connected to an external apparatus. Each of the plurality of the conductive connection portions 73 constitutes any of the input terminal and output terminal (N terminal, P terminal) of the semiconductor device 70.

In addition, the resin structure 71 of this embodiment includes at least 3 through holes 77 corresponding to the holes for inserting the fastening members in the cooling apparatus 10. The through hole 77 penetrates the resin structure 71 in the z axis direction. The resin structure 71 of this embodiment includes a first through hole 77-1, a second through hole 77-2, a third through hole 77-3, a fourth through hole 77-4, a fifth through hole 77-5 and a sixth through hole 77-6. In planar view, the first through hole 77-1, the third through hole 77-3, the fifth through hole 77-5 and the sixth through hole 77-6 are positioned at the four rectangular corners of the resin structure 71.

The cooling apparatus 10 has a top plate 20, a side wall 36, a bottom plate 64, a coolant flow portion 92, an inlet 41, an outlet 42, and a plurality of the fins 94. In this embodiment, the top plate 20, the side wall 36 and the plurality of fins 94 may be collectively referred to as the base plate 40. The cooling apparatus 10 of this embodiment further has a reinforcing portion 25.

The top plate 20 is a board-shaped member with a principal surface extending to the xy plane. The top plate 20 has the circuit boards 76 of the semiconductor devices 70 fixed on the principal surface. The top plate 20 of this embodiment also has the resin structure 71 fixed on the principal surface. The top plate 20 of this embodiment is a rectangle in planar view, to be more specific, a rectangle with longer sides and shorter sides. The top plate 20 of this embodiment has the shorter sides parallel to the x axis and the longer sides parallel to the y axis. In addition, in this specification, when referred to as a rectangle, a square, a quadrangle, a rhomboidal or a polygon or the like, these shapes may also have at least one corner to be chamfered or in a smooth shape.

The top plate 20 includes at least 3 through holes 80 for inserting the fastening members that fasten the semiconductor module 100 to the external apparatus, for example, bolts, bosses, screws or the like. The through hole 80 penetrates the top plate 20 in the z axis direction. The top plate 20 of this embodiment includes a first through hole 80-1, a second through hole 80-2, a third through hole 80-3, a fourth through hole 80-4, a fifth through hole 80-5 and a sixth through hole 80-6. In planar view, the first through hole 80-1, the third through hole 80-3, the fifth through hole 80-5 and the sixth through hole 80-6 are positioned at four rectangular corners of the top plate 20.

As shown in FIG. 3, the top plate 20 has an upper surface (front surface) 22 and a lower surface (back surface) 24 parallel to the xy plane. The top plate 20 is formed by, as one example, metals, as one more specific example, metals including aluminum. The top plate 20 may also have a plated layer of nickel or the like formed on the surface.

In this embodiment, on the upper surface 22 of the top plate 20, the circuit board 76 of the semiconductor device 70 is directly fixed by the solder 79. More specifically, on the principal surface of the top plate 20, the metal layer 85 of the circuit board 76 are firmly fixed by the solder 79. The heat generated in each semiconductor chip 78 is transferred to the top plate 20. The top plate 20, the circuit board 76 and the semiconductor chip 78 are arranged toward the positive direction of the z axis direction in this order. The top plate 20 and the circuit board 76, and the circuit board 76 and the semiconductor chip 78, may have a thermal connection therebetween. In this embodiment, the solder 79 fixes between each member and each of the members are thermally connected via the solder 79. Also, the top plate 20 of this embodiment has the above-mentioned accommodating portion 72 firmly fixed on the principal surface by the fixing agent.

The side wall 36 is connected to the top plate 20. The side wall 36 of this embodiment is integrally configured with the top plate 20, extending from the top plate 20 toward the z axis negative direction. The side wall 36 constitutes the side surface of the cooling apparatus 10. The side wall 36 is formed by, as one example, metals, and as one more specific example, formed by metals including aluminum, the same as the top plate 20.

As shown in FIG. 6, the side wall 36 of this embodiment includes a thin portion 36-1 and a thick portion 36-2. The thin portion 36-1 and the thick portion 36-2 differ from each other in thickness in a cross section parallel to the principal surface of the top plate 20. The thickness of the thin portion 36-1 may also be approximately constant, for example, from 1 mm to 3 mm. The thick portion 36-2 is thicker than the thin portion 36-1, with the thickness continuously changing along a continuous direction of the side wall 36. The thin portion 36-1 and the thick portion 36-2 are formed continuously and alternately along the continuous direction of the side wall 36.

The side wall 36 of this embodiment has a rectangular contour generally in the xy plane, to be more specific, a rectangular contour with longer sides and shorter sides. In the xy plane, the contour of the side wall 36 of this embodiment is positioned in inner side than the contour of the top plate 20. In addition, the contour may also indicate the lines that form the outline of an object.

The bottom plate 64 is connected to the side wall 36, facing the top plate 20. The bottom plate 64 of this embodiment is a board-shaped member. The bottom plate 64 of this embodiment is a rectangle in planar view, to be more specific, a rectangle with longer sides and shorter sides. In addition, the bottom plate 64 of this embodiment has the shorter sides parallel to the x axis and the longer sides parallel to the y axis direction.

The bottom plate 64 includes at least 3 through holes 65 for inserting the fastening members, for example, bosses, which fasten the semiconductor module 100 to the external apparatus, the same as the top plate 20. The through hole 65 penetrates the bottom plate 64 in the z axis direction. The bottom plate 64 of this embodiment includes a first through hole 65-1, a second through hole 65-2, a third through hole 65-3, a fourth through hole 65-4, a fifth through hole 65-5 and a sixth through hole 65-6. In planar view, the first through hole 65-1, the third through hole 65-3, the fifth through hole 65-5 and the sixth through hole 65-6 are positioned at the four rectangular corners of the bottom plate 64.

In this embodiment, as shown in FIG. 1 to FIG. 6, the first through hole 77-1 of the resin structure 71, the first through hole 80-1 of the top plate 20 and the first through hole 65-1 of the bottom plate 64 are arranged to be coaxial. Also, the second through hole 77-2 of the resin structure 71, the second through hole 80-2 of the top plate 20 and the second through hole 65-2 of the bottom plate 64 are arranged to be coaxial. Also, the third through hole 77-3 of the resin structure 71, the third through hole 80-3 of the top plate 20, and the third through hole 65-3 of the bottom plate 64 are arranged to be coaxial.

Also, the fourth through hole 77-4 of the resin structure 71, the fourth through hole 80-4 of the top plate 20, and the fourth through hole 65-4 of the bottom plate 64 are arranged to be coaxial. Also, the fifth through hole 77-5 of the resin structure 71, the fifth through hole 80-5 of the top plate 20, and the fifth through hole 65-5 of the bottom plate 64 are arranged to be coaxial. Also, the sixth through hole 77-6 of the resin structure 71, the sixth through hole 80-6 of the top plate 20, and the sixth through hole 65-6 of the bottom plate 64 are arranged to be coaxial.

In this way, the through holes 77 of the resin structure 71, the through holes 80 of the top plate 20 and the through holes 65 of the bottom plate 64 penetrate at least the resin structure 71, the top plate 20 and the bottom plate 64 in one direction. Furthermore, the through holes 80 of the top plate 20 and the through holes 65 of the bottom plate 64 that are arranged coaxial with each other may also penetrate the top plate 20, the side wall 36 and the bottom plate 64 in one direction. In this embodiment, as shown in FIG. 3 to FIG. 6, the groups of each of the first through hole 80-1 to the fifth through hole 80-5 of the top plate 20, and each of the first through hole 65-1 to the fifth through hole 65-5 of the bottom plate 64 penetrate the top plate 20, the side wall 36 and the bottom plate 64 in the z axis direction.

These groups of the first through hole 80-1 and so on and the first through hole 65-1 and so on are formed in the thick portion 36-2 of the side wall 36. In this way, the coolant flow portion 92 can be enlarged and the cooling efficiency can be improved without enlarging the semiconductor module 100, and on the other hand, the rigidity against a strong fastening force that can be applied (to the semiconductor module 100) when the semiconductor module 100 is tightly fastened to an external apparatus with a bolt or the like can be improved.

In addition, on the inner surfaces of the through hole 80 and the through hole 65, which penetrate the top plate 20, the side wall 36 and the bottom plate 64 in one direction, may have, for example, threaded grooves having a shape formed complementary to the threads of the screws screwed herein, or may have smooth curved surfaces overall, or may have threaded grooves partially formed among the smooth curved surfaces.

As shown in FIG. 5, in top plate 20, the thickness T1 in the z axis direction of the portion facing the coolant flow portion 92 is thinner when compared to the representative thickness T2 of the thick portion 36-2 of the side wall 36 in the xy plane, and the thickness T3 in the z axis direction of the bottom plate 64. By thinning the thickness of the top plate 20, the heat from the semiconductor devices 70 arranged on the upper surface 22 of the top plate 20 can be transferred efficiently to the coolant flowing inside the coolant flow portion 92.

On the other hand, in the portion of the top plate 20 where the through holes 80 are formed, the thick portion 36-2 of the side wall 36 extends toward the z axis negative direction, and has a higher intensity compared to the portion facing the coolant flow portion 92. In this way, the top plate 20 can be prevented from being broken by the above-mentioned fastening force.

In addition, by arranging the plurality of thick portions 36-2 along the continuous direction of the side wall 36, the intensity of the side wall 36 can be improved, and in this way, deformations such as torsion due to mechanical or thermal effects on the top plate 20 can be prevented to occur. In this way, the semiconductor module 100 can prevent the occurrence of large stresses and plastic strains in the solder 79 for fixing the semiconductor device 70 on the top plate 20.

In addition, the thickness T3 in the z axis direction of the bottom plate 64 is thicker than the thickness T1 of the portion facing the coolant flow portion 92 in the top plate 20. In this way, the entire rigidity of the cooling apparatus 10 can be improved.

The bottom plate 64 may also be arranged in direct or indirect close contact with the lower end in the z axis negative direction of the side wall 36. The indirect close contact refers to a state in which the lower end of the side wall 36 is in close contact with the bottom plate 64, via the fixing agent 98 provided between the lower end of the side wall 36 and the bottom plate 64, such as sealants, adhesives, and brazing materials. In this embodiment, the bottom plate 64 is arranged in close contact with the lower end of the side wall 36 via the fixing agent 98. The bottom plate 64 is formed by, as one example, metals, and as one more specific example, metals including aluminum, the same as the base plate 40.

In addition, the lower end of the side wall 36 and the bottom plate 64 are preferably brazed to each other. In this case, the brazing material is preferably a metal with a lower melting temperature than the base plate 40 and the bottom plate 64.

The coolant flow portion 92 is a space for distributing the coolant such as, for example, LLC or water, which is defined by the top plate 20, the side wall 36 and the bottom plate 64. In other words, the side wall 36 is arranged enclosing the coolant flow portion 92 in the xy plane, and the top plate 20 and the bottom plate 64 are arranged to face each other, sandwiching the coolant flow portion 92 in the z axis direction. Thus, the contour of the coolant flow portion 92 in the xy plane is defined by the inner circumference of the side wall 36. Therefore, the coolant flow portion 92 is generally a rectangle in planar view. More specifically, as shown in FIG. 6, the coolant flow portion 92 is generally a rectangle whose cross section parallel to the principal surface of the top plate 20 has longer sides 96 and shorter sides 93. In addition, in this embodiment, the direction of the longer sides 96 is the y axis direction, and the direction of the shorter sides 93 is the x axis direction.

The coolant flow portion 92 may also be sealed by the top plate 20, the side wall 36 and the bottom plate 64, and in this case, the lower end of the side wall 36 may also be in close contact with the bottom plate 64. In addition, the close contact refers to the state that the coolant inside the coolant flow portion 92 does not leak out from the portion in close contact.

The inlet 41 is a hole for introducing coolant to the coolant flow portion 92, which is formed on the bottom plate 64. The outlet 42 is a hole for deriving the coolant from the coolant flow portion 92, which is formed on the bottom plate 64, the same as the inlet 41. By forming the inlet 41 and the outlet 42 on the thickest bottom plate 64 inside a configuration defining the coolant flow portion 92, the intensity of the cooling apparatus 10 can be improved, and the processing of the cooling apparatus 10 can be simplified.

The inlet 41 and the outlet 42 are respectively positioned on one side of the cooling apparatus 10 and on another side opposite to the one side in the x axis direction, and, respectively positioned on one side of the cooling apparatus 10 and on another side opposite to the one side in the y axis direction. That is, the inlet 41 and the outlet 42 are positioned in both opposite ends of the coolant flow portion 92 in the diagonal line direction of the coolant flow portion 92 having a rectangular shape in the xy plane.

The plurality of fins 94 are arranged in the coolant flow portion 92, extending to connect between the top plate 20 and the bottom plate 64. The above-mentioned coolant flow portion 92 includes a cooling region 95 where a plurality of fins 94 are arranged. In addition, in FIG. 3, instead of illustrating the fins 94, the cooling region 95 is shown by dots. In addition, in the below description, one or more fins 94 may be taken simply as fins 94.

The cooling region 95 may also be a rectangle in planar view. As shown in FIG. 6, the cooling region 95 of this embodiment is a rectangle in planar view, with the shorter sides parallel to the x axis, and the longer sides parallel to the y axis.

In the cooling region 95 of this embodiment, the number of the fins 94 arranged in the direction of the longer side 96 of the coolant flow portion 92 is greater than the number of the fins 94 arranged in the direction of the shorter side 93 of the coolant flow portion 92. The cooling region 95 includes the region where the fins 94 are provided, and flow channels between the fins 94. In addition, the interval between adjacent fins 94 may also be narrower than the width of the fins 94 themselves.

The coolant flow portion 92 further includes a first header 30-1 in contact with one side of the cooling region 95, and a second header 30-2 in contact with the other side which is the opposite side of the one side of the cooling region 95. In other words, the coolant flow portion 92 includes a first header 30-1 and a second header 30-2 arranged sandwiching the cooling region 95 in planar view. In this embodiment, the first header 30-1 is in contact with the negative side of the x axis direction of the cooling region 95, and the second header 30-2 is in contact with the positive side of the x axis direction of the cooling region 95. These headers 30 refer to the spaces with a height equal to or higher than a predetermined height (length in the z axis direction) in the coolant flow portion 92. The height equal to or higher than the predetermined height may be the distance between the top plate 20 and the bottom plate 64.

The first header 30-1 of this embodiment communicates with the inlet 41 described above, without a plurality of fins 94 arranged thereon. Similarly, the second header 30-2 of this embodiment communicates with the outlet 42 mentioned above, without a plurality of fins 94 arranged thereon. In addition, in the first header 30-1 and the second header 30-2, for example, the blade fins to guide the flowing of the coolant or the pin fins for reinforcing the top plate 20 and so on may also be arranged thereon.

In addition, in this embodiment, each of the first header 30-1 and the second header 30-2 has a longer length in the y axis direction than in the x axis direction, and extends in the y axis direction in planar view.

The fins 94 are formed by, as one example, metals, and as one more specific example, formed by metals including aluminum, the same as the top plate 20.

The fins 94 have upper ends and lower ends facing each other in the z axis direction. The upper ends of the fins 94 of this embodiment are thermally and mechanically connected with the lower surface 24 of the top plate 20. In this embodiment, the fins 94 are configured integrally together with the top plate 20, in other words, the fins 94 protrude integrally from the lower surface 24 of the top plate 20. The fins 94 of this embodiment are extending in the negative z axis direction from the lower surface 24 of the top plate 20 toward the coolant flow portion 92.

The lower ends of the fins 94 of this embodiment are firmly fixed on the bottom plate 64 by the fixing agent 98. Further, the extending direction of the fins 94 of this embodiment is approximately orthogonal to each principal surface of the top plate 20 and the bottom plate 64.

In this embodiment, each of the plurality of fins 94 is a pin fin. Also, the cross section parallel to the principal surface of the top plate 20 of each of the plurality of fins 94 in this embodiment is a rectangle in shape. Thereby, compared to the case where the cross section of the fin is a circle in shape, the surface area of fin 94 in contact with the coolant can be enlarged, and the heat dissipation efficiency can be improved.

In addition, the plurality of fins 94 may also be arranged in the coolant flow portion 92 so that the main flow direction of the coolant in the cooling region 95 is not orthogonal to any side of the rectangle when the coolant is flowing through the coolant flow portion 92. In the example of this embodiment, the main flow direction of the coolant in the cooling region 95 is the x axis direction. In this embodiment, the plurality of fins 94 are arranged in the coolant flow portion 92 so that any side of the rectangle is not orthogonal to the x axis direction. More specifically, the plurality of fins 94 of this embodiment are arranged in the coolant flow portion 92 so that any side of the rectangle is not orthogonal to the x axis direction, and, one diagonal line is parallel to the y axis direction, and the other one diagonal line is parallel to the x axis direction. Instead of this, the plurality of fins 94 may also be arranged in the coolant flow portion 92 so that any side of the rectangle is not orthogonal to the x axis direction, and, one diagonal line is inclined with respect to the y axis direction, and the other one diagonal line is inclined with respect to the x axis direction. Compared with the case where the plurality of fins are arranged in the coolant flow portion 92 so that any side of the above-mentioned rectangle is orthogonal to the above-mentioned main flow direction, the flow velocity loss of the coolant flowing inside the coolant flow portion 92 can be reduced, and the heat dissipation efficiency can be improved by any of the above-mentioned configurations.

Also, the fins 94 of this embodiment have rhomboidal shapes that are longer in the direction of the shorter side 93 than in the direction of the longer side 96 of the coolant flow portion 92 in the cross section of the xy plane. Also, of one pair of diagonal lines of the rhomboidal shape, the diagonal line parallel to the longer side 96 is shorter than the diagonal line parallel to the shorter side 93. The fins 94 may also have a length of 1.9 mm to 2.2 mm on each side of the rhomboidal cross section. At each corner of the rhomboidal cross section, there may also be a rounding with a radius of curvature of 0.1 mm to 0.2 mm.

In addition, the shape of the cross section of each of the plurality of fins 94 may also be a polygon, for example, may also be a square. In this case, the plurality of fins 94 may also be arranged in the coolant flow portion 92 so that one diagonal line of the square is along the direction from the first header 30-1 toward the second header 30-2.

Also, the plurality of fins 94 may also be arrayed to form a predetermined pattern in the xy plane of the coolant flow portion 92. In this embodiment, the plurality of fins 94 are in a staggered array as shown in FIG. 6. The plurality of fins 94 may also be in a square array in the xy plane of the coolant flow portion 92.

As shown in FIG. 6, in planar view, any metal layer 85 of U phase unit 70U, V phase unit 70V and W phase unit 70W of this embodiment has a part overlapped with the cooling region 95, and the other parts excepting for the one part, the other parts being overlapped with the first header 30-1 and the second header 30-2. The metal layers 85 of U phase unit 70U and the like have a part overlapped with the cooling region 95, and the other parts excepting for the one part may overlap one of the first header 30-1 and the second header 30-2, or may overlap the cooling region 95 as a whole in planar view.

As shown in FIG. 3 and FIG. 6, the reinforcing portion 25 is positioned outside the coolant flow portion 92, and connected to the top plate 20 and the bottom plate 64. The fifth through hole 80-5 and the fifth through hole 65-5 mentioned above penetrate the top plate 20, the reinforcing portion 25 and the bottom plate 64 in the z axis direction. In addition, the reinforcing portion 25 may also be connected to the side wall 36, in other words, may also be a part of the side wall 36. In this case, the reinforcing portion 25 constitutes one thick portion 36-2 of the side wall 36.

Figure 7:
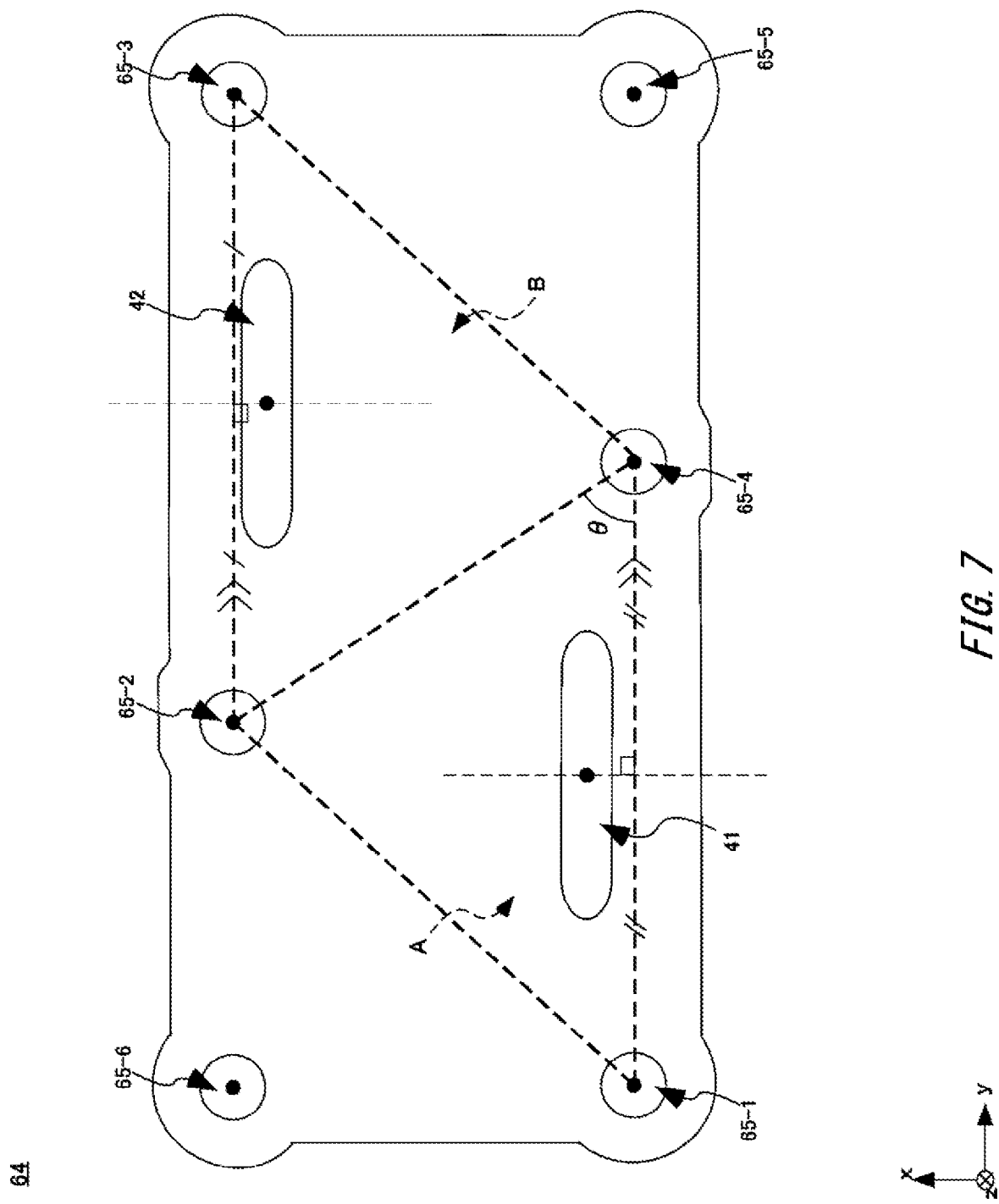
FIG. 7 illustrates a schematic bottom view showing one example of a bottom plate 64 of the semiconductor module 100 according to one embodiment of the present invention.

FIG. 7 illustrates a schematic bottom view showing one example of the bottom plate 64 of the semiconductor module 100 according to one embodiment of the present invention. In FIG. 7, the geometric centers of gravity of the through holes 65, the inlet 41 and the outlet 42 in planar view are indicated by black circles. Also, the lines for describing the position of each geometric center of gravity are indicated by dashed lines. In addition, the angle formed by two specific dashed lines is indicated by θ. In addition, in the below description, there may be a case where only the through holes 65 of the bottom plate 64 among the through holes of the semiconductor module 100 are described, but the through holes 80 of the top plate 20 and the through holes 77 of the resin structure 71 that are positioned coaxial with the through holes 65 of the bottom plate 64 are all just the same, and the repeated descriptions are omitted.

In planar view, the geometric center of gravity of the aperture of at least one of the inlet 41 and the outlet 42 is positioned inside the virtual triangle with the three through holes 65 being the vertexes. Two through holes 65 of the three through holes 65 may also be positioned on both sides of the aperture. In addition, in planar view, the perpendicular bisector of the line segment connecting the points positioned inside each of the two through holes 65 may also pass through the aperture. More preferably, in planar view, the perpendicular bisector of the line segment connecting the geometric centers of gravity of the respective two through holes 65 may also pass through the geometric centers of gravity of the aperture. In addition, the outer edge of the aperture may also preferably be positioned inside the virtual triangle with the three through holes 65 as the vertexes.

In this embodiment, in planar view, the first through hole 65-1 and the fourth through hole 65-4 are positioned on both sides of the inlet 41, and the second through hole 65-2 and the third through hole 65-3 are positioned on both sides of the outlet 42. In addition, in planar view, when seeing from a direction orthogonal to the line connecting the first through hole 65-1 and the fourth through hole 65-4, the second through hole 65-2 is positioned between the first through hole 65-1 and the fourth through hole 65-4.

As shown in FIG. 7, in this embodiment, furthermore, the geometric center of gravity of the inlet 41 is positioned inside the virtual triangle A with the first through hole 65-1, the fourth through hole 65-4 and the second through hole 65-2 being the vertexes in planar view. Similarly, in planar view, the geometric center of gravity of the outlet 42 is positioned inside the virtual triangle B with the second through hole 65-2, the third through hole 65-3 and the fourth through hole 65-4 being the vertexes.

In this embodiment, furthermore, when seeing from a direction orthogonal to the straight line connecting the first through hole 65-1 and the fourth through hole 65-4, at least a part of the second through hole 65-2 overlaps the inlet 41. When seeing from a direction orthogonal to the straight line connecting the first through hole 65-1 and the fourth through hole 65-4, the geometric center of gravity of the second through hole 65-2 may also match the geometric center of gravity of the inlet 41. And similarly, in this embodiment, when seeing from a direction orthogonal to the straight line connecting the second through hole 65-2 and the third through hole 65-3, at least a part of the fourth through hole 65-4 overlaps the outlet 42. When seeing from a direction orthogonal to the straight line connecting the second through hole 65-2 and the third through hole 65-3, the geometric center of gravity of the fourth through hole 65-4 may also match the geometric center of gravity of the outlet 42.

In addition, in this embodiment, the outer edge of the inlet 41 is positioned inside the virtual triangle with the first through hole 65-1, the fourth through hole 65-4 and the second through hole 65-2 being the vertexes in planar view. And similarly, the outer edge of the outlet 42 may be positioned inside the virtual triangle with the third through hole 65-3, the second through hole 65-2 and the fourth through hole 65-4 being the vertexes in planar view. With such arrangements, the sealing property of the coolant flow channels via the inlet 41 and the outlet 42 can be improved.

In addition, as shown in FIG. 7, in this embodiment, the line connecting the first through hole 65-1 and the fourth through hole 65-4 is preferably parallel to the line connecting the third through hole 65-3 and the second through hole 65-2. Furthermore, in this embodiment, the angle θ formed by the line connecting the first through hole 65-1 and the fourth through hole 65-4 and the line connecting the second through hole 65-2 and the fourth through hole 65-4 is preferably an acute angle.

Figure 8:
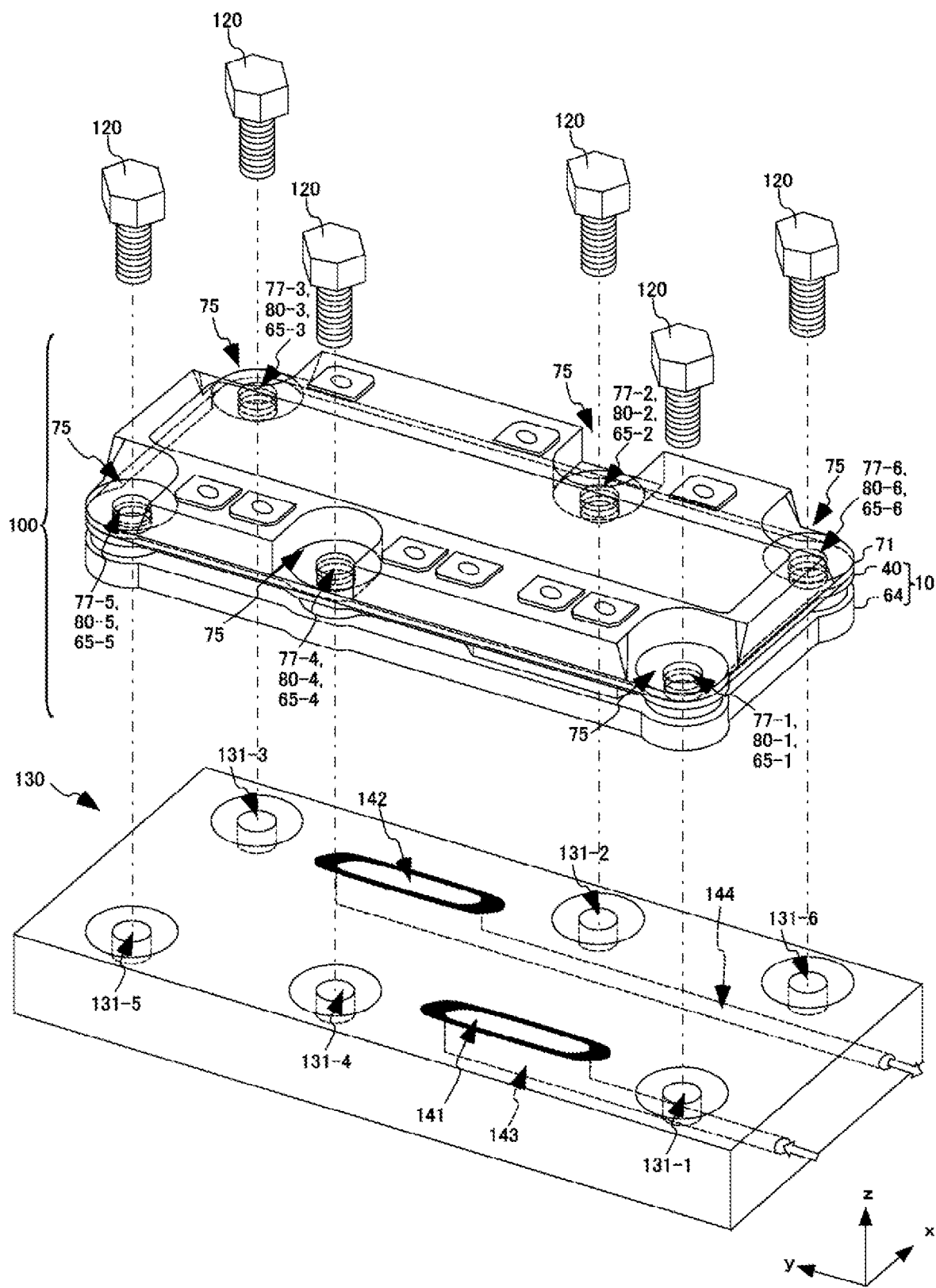
FIG. 8 illustrates a schematic perspective view showing one example of a state when the semiconductor module 100 according to one embodiment of the present invention is implemented in a coolant supply unit 130.

FIG. 8 illustrates a schematic perspective view showing one example of the state when the semiconductor module 100 according to one embodiment of the present invention is implemented in the coolant supply unit 130. In addition, FIG. 9 illustrates a schematic perspective view showing one example of a state when the semiconductor module 100 according to one embodiment of the present invention is implemented in the coolant supply unit 130.

In this embodiment, each of the inlet 41 and the outlet 42 formed on the bottom plate 64 communicates with the inlet 141 and the outlet 142 of the external coolant supply unit 130, and the coolant flow channels are formed between the cooling apparatus 10 and the coolant supply unit 130. The inlet 141 and the outlet 142 communicates with the introducing tube 143 and the deriving tube 144 formed inside the coolant supply unit 130, respectively. Each of the inlet 141 and the outlet 142 is formed on the flange of the coolant supply unit 130.

The coolant supply unit 130 makes the coolant flow into the coolant flow portion 92 through the inlet 41 from the introducing tube 143 and the inlet 141, and makes the coolant flowing inside the coolant flow portion 92 flow out through the outlet 142 and the deriving tube 144 from the outlet 42. Accordingly, the cooling apparatus 10 imports the coolant from the external coolant supply unit 130 via the inlet 41, and the coolant is exported after circulating the interior of the coolant flow portion 92 from the coolant supply unit 130 via the outlet 42.

Figure 9:
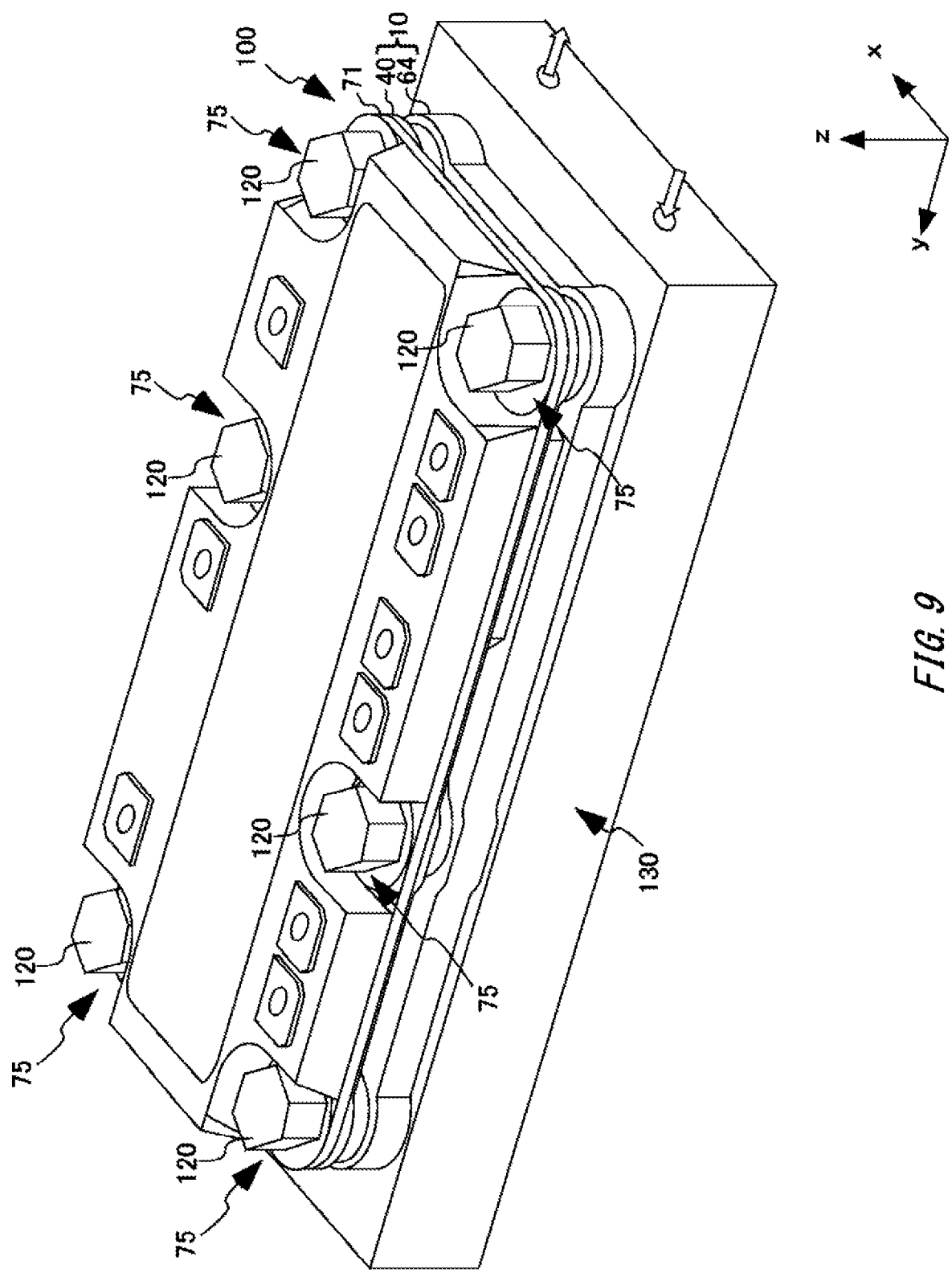
FIG. 9 illustrates a schematic perspective view showing one example of a state when the semiconductor module 100 according to one embodiment of the present invention is implemented in the coolant supply unit 130.

Herein, FIG. 9 illustrates a state when the semiconductor module 100 is fastened to the coolant supply unit 130 by the fastening members 120. When the semiconductor module 100 is fastened to the coolant supply unit 130 by the fastening members 120, strong fastening force due to the fastening members 120 is applied to the cooling apparatus 10 of the semiconductor module 100 through the through holes 77 of the resin structure 71, the through holes 80 of the top plate 20, and the through holes 65 of the bottom plate 64 in order to improve the sealing property of the above-mentioned coolant flow channels. The surrounding of the inlet 41 and outlet 42 of the cooling apparatus 10 is pressed around the inlet 141 and outlet 142 of the coolant supply unit 130 via sealing materials, for example, rubber O rings. Each of the apertures of the inlet 41 and the outlet 42 may be a round rectangle, rectangle, a circle or an ellipse in planar view. On the lower surface of the bottom plate 64, the sealing surface for supporting the sealing materials around each aperture of the inlet 41 and the outlet 42 may be provided.

According to the semiconductor module 100 of this embodiment described above, the top plate 20 and the bottom plate 64 of the cooling apparatus 10 include at least three groups of the through holes 80 and the through holes 65 for inserting the fastening members 120. Furthermore, according to the semiconductor module 100, in planar view, the geometric center of gravity of the aperture of at least one of the inlet 41 and the outlet 42 is positioned inside the virtual triangle with the three groups of the through holes 80 and the through holes 65 being the vertexes. According to the semiconductor module 100 including the configuration, when implemented in an external apparatus such as the coolant supply unit 130, the sealing material distributed around the aperture can be compressed evenly from three different directions, effectively preventing the occurrence of liquid leakage in the coolant flow channel formed between the aperture and the external apparatus.

In addition, as shown in FIG. 2 and FIG. 9, the resin structure 71 includes recessed portions 75 for accommodating the heads of the screws when the fastening members 120 are screws. The recessed portion 75 can prevent the heads of the screw from protruding outwardly of the resin structure 71 at the state when the screw is inserted into the through hole 77 and so on to fasten the semiconductor module 100 to an external apparatus.

In addition, in the semiconductor module 100 of this embodiment, an arrangement configuration is included where the main flow direction of the coolant flowing to the cooling apparatus 10 (positive direction of the x axis) is orthogonal to the arrangement direction of the plurality of the heat sources (y axis direction). For example, when a plurality of heat sources such as semiconductor chips 78 exist on the top plate 20 of the cooling apparatus 10 in the y axis direction, if the main flow direction of the coolant flowing to the cooling apparatus 10 is parallel to the arrangement direction of the heat sources (the y axis direction), the respective heat sources cannot be cooled down uniformly.

In contrast to this, according to the semiconductor module 100 of this embodiment, in the coolant flow portion 92, the cross section parallel to the principal surface of the top plate 20 (in the xy plane) is a rectangle with the longer sides 96 and the shorter sides 93, and the coolant is introduced into the coolant flow portion 92 from the inlet 41 communicating with one side of the shorter side 93 direction (the x axis direction), and then diffused throughout the coolant flow portion 92, and then derived from the outlet 42 communicating the other side of the shorter side 93 direction (the x axis direction). The coolant contacts the lower surface 24 of the top plate 20 with the circuit board 76 placed thereon and the fins 94, and cools down each semiconductor chip 78 of the semiconductor devices 70. In other words, the heat generated by each semiconductor chip 78 is transferred by the coolant passing through the vicinity of the top plate 20 and the fins 94.

Thus, according to the semiconductor module 100 of this embodiment, the cooling apparatus 10 can efficiently cool the heat generated by each semiconductor chip 78 arranged in the y axis direction on the upper surface of the cooling apparatus 10 by the coolant.

In the above embodiments, the top plate 20, the side wall 36 and the fins 94, which constitute the base plate 40, may also be configured integrally. In this embodiment, the top plate 20, the side wall 36 and the fins 94 may also be formed integrally. For example, the top plate 20, the side wall 36 and the fins 94 may also be formed integrally from one piece of continuous plate member.

For example, the top plate 20, side wall 36 and fins 94 may also be formed integrally by conducting a punching processing using the molds corresponding to the shapes of the top plate 20, side walls 36 and fins 94 on one piece of continuous plate member. As another example, the top plate 20, side wall 36 and fins 94 may also be formed integrally by conducting molding using any forging method such as cold forging in room temperature environment using an impact press and so on, or warm forging, hot forging or molten metal forging in high temperature environment, or by conducting molding by casting. The semiconductor module 100 of this embodiment can reduce the number of the members compared with the form of firmly fixing separately-formed parts to each other by integrally forming the top plate 20, the side wall 36 and the fins 94.

Figure 10:
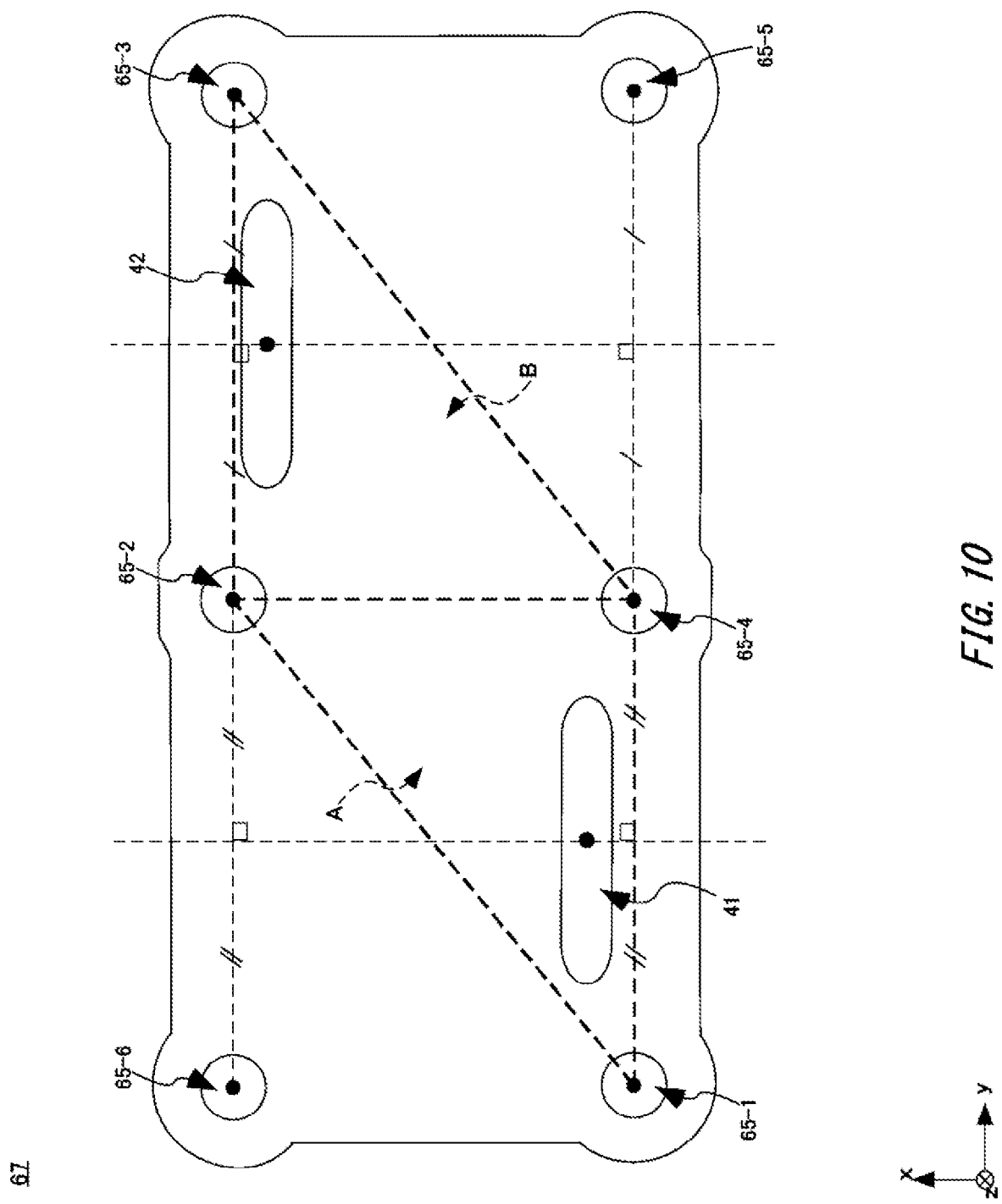
FIG. 10 illustrates a schematic bottom view showing one example of a bottom plate 67, which is a modification example of the bottom plate 64 of the semiconductor module 100 according to one embodiment of the present invention.

FIG. 10 illustrates a schematic bottom view showing one example of the bottom plate 67 that is a modification example of the bottom plate 64 of the semiconductor module 100 according to one embodiment of the present invention. In addition, FIG. 11 illustrates a schematic bottom view showing one example of the bottom plate 68 that is a modification example of the bottom plate 64 of the semiconductor module 100 according to one embodiment of the present invention.

In FIG. 10 and FIG. 11, only the bottom plate 67 and the bottom plate 68 of each semiconductor module 100 are illustrated, and the illustrations of the other configurations of the semiconductor module 100 are omitted. Also, in FIG. 10 and FIG. 11, the same as FIG. 7, the geometric centers of gravity of the through holes 65, the inlet 41 and the outlet 42 in planar view are shown as black circles. Also, the lines for describing the position of each geometric center of gravity are indicated by dashed lines.

Also, in the modification example shown in FIG. 10 and FIG. 11, when compared with the configuration of the semiconductor module 100 in the embodiment described using FIG. 1 to FIG. 9, only the arrangements, numbers and/or the dimensions of the specific configurations are different, and the functions and applications are just the same. Thus, each configuration of the modification example shown in FIG. 10 and FIG. 11 uses the same reference number as each configuration in the embodiment described using FIG. 1 to FIG. 9, and omits the repeated descriptions.

In the bottom plate 67 of the modification example shown in FIG. 10, in planar view, the perpendicular bisector of the line segment connecting the respective geometric center of gravity of the first through hole 65-1 and the fourth through hole 65-4 passes through the geometric center of gravity of the inlet 41. Also, in this embodiment, in planar view, the first through hole 65-1 and the fourth through hole 65-4 are positioned on both sides of the inlet 41, and the second through hole 65-2 and the third through hole 65-3 are positioned on both sides of the outlet 42. Also, in planar view, when seeing from a direction orthogonal to the line connecting the first through hole 65-1 and the fourth through hole 65-4, the second through hole 65-2 is positioned between the first through hole 65-1 and the fourth through hole 65-4.

Also, as shown in FIG. 10, in this embodiment, furthermore, the geometric center of gravity of the inlet 41 is positioned inside the virtual triangle A with the first through hole 65-1, the fourth through hole 65-4 and the second through hole 65-2 being the vertexes in planar view. Similarly, in planar view, the geometric center of gravity of the outlet 42 is positioned inside the virtual triangle B with the second through hole 65-2, the third through hole 65-3 and the fourth through hole 65-4 being the vertexes.

Furthermore, in this embodiment, when seeing from a direction orthogonal to the straight line connecting the first through hole 65-1 and the fourth through hole 65-4, at least a part of the second through hole 65-2 overlaps the fourth through hole 65-4, and at least a part of the fifth through hole 65-5 overlaps the third through hole 65-3. Also, when seeing from a direction orthogonal to the straight line connecting the first through hole 65-1 and the fourth through hole 65-4, at least a part of the sixth through hole 65-6 overlaps the first through hole 65-1.

In addition, in this embodiment, the outer edge of the inlet 41 is positioned inside the virtual triangle with the first through hole 65-1, the fourth through hole 65-4 and the second through hole 65-2 as the vertexes in planar view. And similarly, the outer edge of the outlet 42 may be positioned inside the virtual triangle with the third through hole 65-3, the second through hole 65-2 and the fourth through hole 65-4 being the vertexes in planar view. The semiconductor module 100 according to this modification example has the same effect as mentioned above.

The bottom plate 68 of the modification example shown in FIG. 11, excepting for the points that the fifth through hole 65-5 and the sixth through hole 65-6 are not included, is the same as the configuration of the bottom plate 64 described using FIG. 1 to FIG. 9. The semiconductor module 100 according to this modification example has the same effect as mentioned above.

Figure 12:
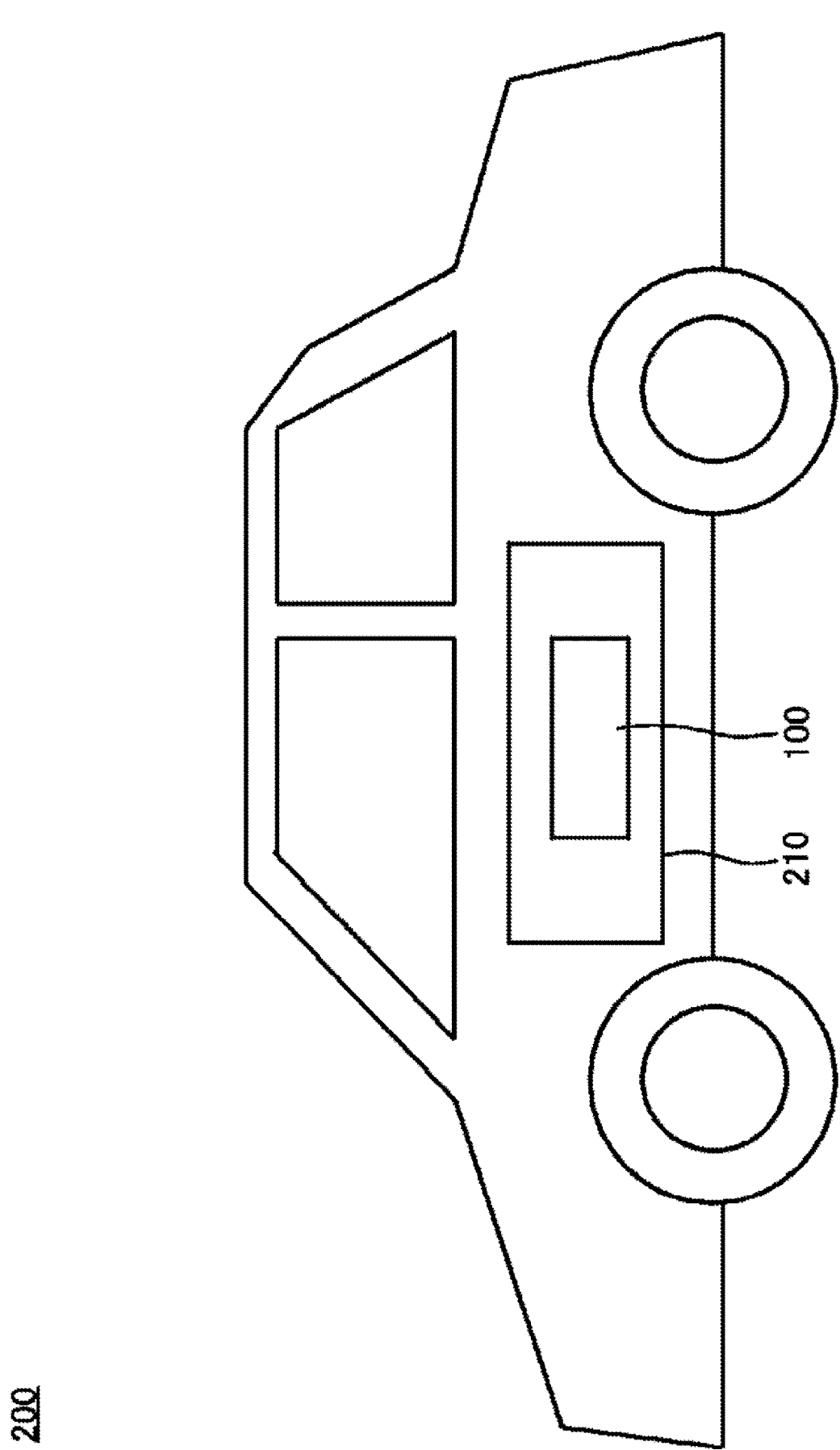
FIG. 12 illustrates a schematic view of a vehicle 200 according to one embodiment of the present invention.

FIG. 12 illustrates a schematic view of a vehicle 200 according to one embodiment of the present invention. The vehicle 200 is a vehicle with at least a part of the driving force being generated using electrical power. One example of the vehicle 200 is an electric vehicle with all the driving force being generated by an electrically driven device such as a motor, or a hybrid vehicle jointly using an electrically driven device such as a motor and an internal combustion engine driven by fuel such as gasoline.

The vehicle 200 includes a control device 210 (external device) for controlling the electrically driven device such as a motor. A semiconductor module 100 is provided with the control device 210. The semiconductor module 100 may control the electrical power supplied to the electrically driven device.

Figure 13:
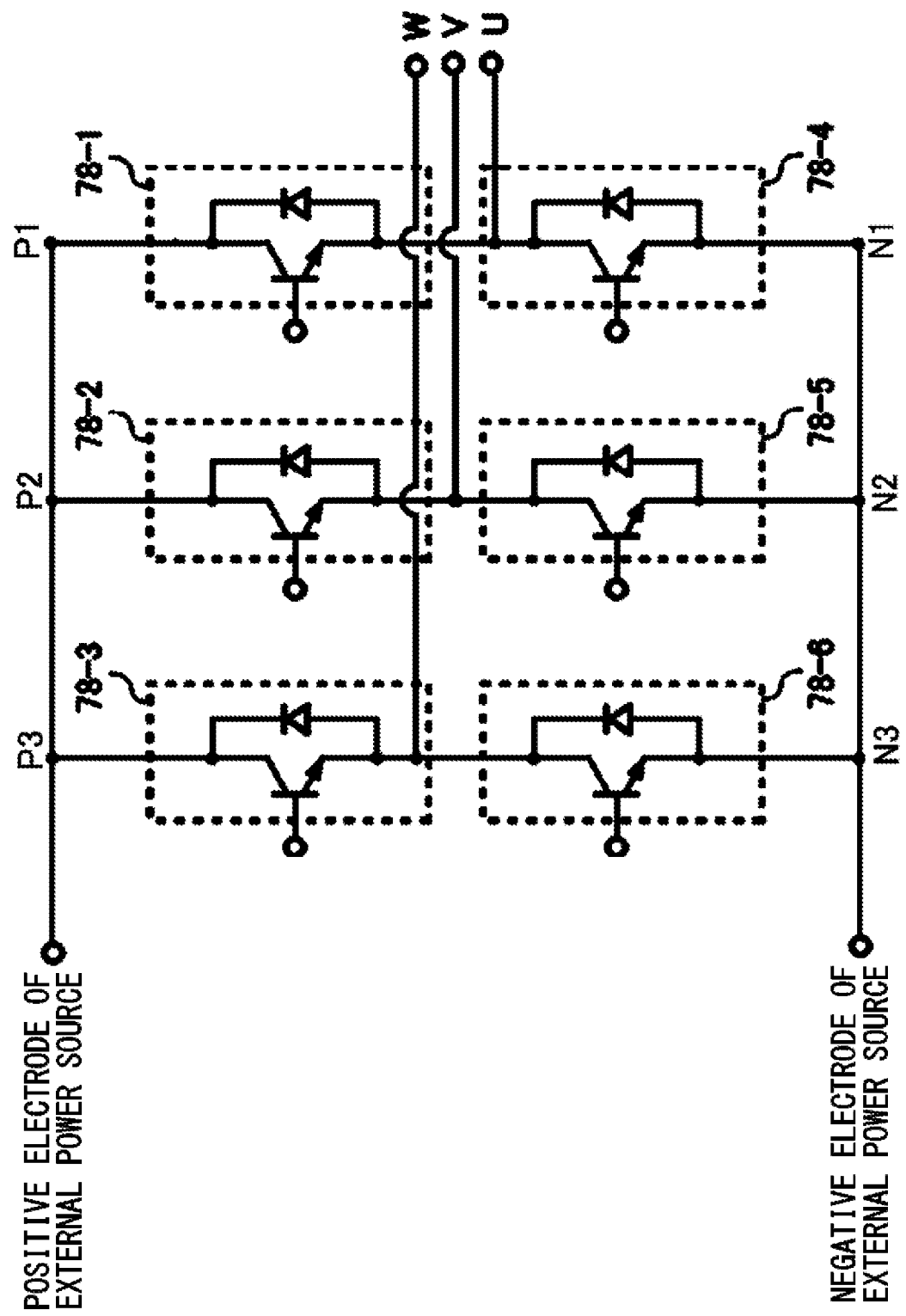
FIG. 13 illustrates a main circuit diagram of the semiconductor module 100 according to one embodiment of the present invention.

FIG. 13 illustrates the main circuit diagram of the semiconductor module 100 according to a plurality of embodiments of the present invention. The semiconductor module 100 may be a part of the on-vehicle unit for driving the motor of a vehicle, functioning as a three-phase AC inverter with output terminals U, V and W.

In the semiconductor module 100, the semiconductor chips 78-1, 78-2 and 78-3 may configure an upper arm, and the semiconductor chips 78-4, 78-5 and 78-6 may configure a lower arm. A group of semiconductor chips 78-1 and 78-4 may configure a leg (U phase). A group of semiconductor chips 78-2 and 78-5, and a group of semiconductor chips 78-3 and 78-6 may also configure legs (V phase, W phase) similarly. In the semiconductor chip 78-4, the emitter electrode may be electrically connected to the input terminal N1, and the collector electrode may be electrically connected to the output terminal U, respectively. In the semiconductor chip 78-1, the emitter electrode may be electrically connected to the output terminal U, and the collector electrode may be electrically connected to the input terminal P1, respectively. Similarly, in semiconductor chips 78-5 and 78-6, the emitter electrodes may be electrically connected to the input terminals N2 and N3, respectively, and the collector electrodes may be electrically connected to the output terminals V and W, respectively. Furthermore, in semiconductor chips 78-2 and 78-3, the emitter electrodes may be electrically connected to the output terminals V and W, respectively, and the collector electrodes may be electrically connected to the input terminals P2 and P3, respectively.

Each of the semiconductor chips 78-1 to 78-6 may be alternately switched by a signal input into the corresponding control terminals. In this embodiment, each semiconductor chip 78 may generate heat during the switching. The input terminals P1, P2 and P3 may be connected to the positive electrode of the external power source, and the input terminals N1, N2 and N3 may be connected to the negative electrode of the external power source, and the output terminals U, V and W may be connected to the loads, respectively. The input terminals P1, P2 and P3 may be electrically connected to each other, and the other input terminals N1, N2 and N3 may also be electrically connected to each other.

In the semiconductor module 100, the plurality of the semiconductor chips 78-1 to 78-6 may be the RC-IGBT (reverse conducting IGBTs) semiconductor chips, respectively. Also, the semiconductor chips 78-1 to 78-6 may include the combinations of diodes and transistors such as MOSFETs or IGBTs, respectively.

In the above descriptions of a plurality of embodiments, for example, such as "approximately orthogonal", "approximately same", "approximately match", "approximately constant", "approximately symmetrical", "approximately rhomboidal", and "approximately rectangular", the words together with "approximately" may be used to describe a specific state, but any of these is intended to include not only those that are strictly in the specific state, but also those that are generally in that specific state.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

For example, in the embodiment mentioned above, the semiconductor module 100 has been described to be a configuration including three semiconductor devices 70, but instead of this, it may also include one, two, or four or more semiconductor devices 70.

For example, the fins 94 may be arranged in a lattice pattern, also preferably in an oblique lattice pattern or rhomboidal grid lattice pattern. And for example, the inlet 41 and the outlet 42 are in contact with the cooling region 95, and may also be provided on the diagonal line in the coolant flow portion 92. And for example, the apertures of the inlet 41 and the outlet 42 may also have the length in the longer side 96 direction longer than the length in the shorter side 93 direction in planar view.

For example, in the embodiment mentioned above, in the base plate 40, the top plate 20, the side wall 36 and the fins 94 have been described to be an integrally formed configuration, but instead of this, the top plate 20, the side wall 36 and the fins 94 may also be firmly fixed onto each other by fixing agent 98 and so on after they are formed respectively. Also, the top plate 20 and the side wall 36 may also be formed integrally, and the separately formed fins 94 may be firmly fixed onto the top plate 20. Also, the top plate 20 and the fins 94 may also be integrally formed, and the separately formed side wall 36 may be firmly fixed onto the top plate 20 by the fixing agent 98 and so on. Also, the side wall 36 and the bottom plate 64 may also be integrally formed by, for example, drawing processing, and the separately formed top plate 20 may also be firmly fixed onto the side wall 36 by the fixing agent 98 and so on, for example, brazing. In this case, the side wall 36 extends toward the outside of the xy plane, and the extending plane of the side wall 36 may also be connected to the lower surface 24 of the top plate 20.

Also, for example, in the embodiment mentioned above, the fins 94 have been described as a configuration being integrally formed with the top plate 20 and extending toward the bottom plate 64, but instead of this, the fins 94 may also be integrally formed with the bottom plate 64, and extend toward the top plate 20 from the bottom plate 64. In addition, in this case, the edge of the fin 94 and the top plate 20 may be firmly fixed together with the fixing agent 98 and so on.

Also, for example, in the embodiment mentioned above, the fins 94 have been described as a configuration extending in the normal line direction of the principal surface of the top plate 20 between the top plate 20 and the bottom plate 64, that is, extending perpendicularly to the top plate 20 and the bottom plate 64, but instead of this, the fins 94 may also extend obliquely with an angle with respect to the normal line direction of the principal surface of the top plate 20 between the top plate 20 and the bottom plate 64. Also, the dimension of the cross section in the xy plane of the fins 94, may be constant in the z axis direction, may also change, and as one more specific example, may also extend from any one of the top plate 20 and the bottom plate 64 to the other to taper toward the edge.

Also, for example, in the embodiment mentioned above, the plurality of fins 94 have been described as pin fins respectively, but instead of this, they may also be board-shaped blade fins, for example, the cross sectional shape parallel to the principal surface of the top plate 20 may be elongated rectangle.

Also, for example, in the diagrams of the embodiment mentioned above, in planar view, the inner side of the side wall 36 have been described as a folded line, but it may not only be limited to a folded line, but also a straight line or a curve. For example, in planar view, the inner side of the side wall 36 and so on may be an arched and bulged curve on the side of the coolant flow portion 92 or an arched and concave curve on the opposite side.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCES

10: cooling apparatus; 20: top plate; 22: upper surface; 24: lower surface; 25: reinforcing portion; 30: header; 30-1: the first header; 30-2: the second header; 36: side wall; 36-1: thin portion; 36-2: thick portion; 40: base plate; 41: inlet; 42: outlet; 64, 67, 68: bottom plate; 65: through hole; 65-1: the first through hole; 65-2: the second through hole; 65-3: the third through hole; 65-4: the fourth through hole; 65-5: the fifth through hole; 65-6: the sixth through hole; 70: semiconductor device; 70U: U phase unit; 70V: V phase unit; 70W: W phase unit; 71: resin structure; 73: conductive connection portion; 75: recessed portion; 77: through hole; 77-1: the first through hole; 77-2: the second through hole; 77-3: the third through hole; 77-4: the fourth through hole; 77-5: the fifth through hole; 77-6: the sixth through hole; 72: accommodating portion; 74: sealing portion; 76: circuit board; 78: semiconductor chip; 79: solder; 80: through hole; 80-1: the first through hole; 80-2: the second through hole; 80-3: the third through hole; 80-4: the fourth through hole; 80-5: the fifth through hole; 80-6: the sixth through hole; 81: insulating plate; 83: circuit layer; 85: metal layer; 92: coolant flow portion; 93: shorter side; 96: longer side; 94: fin; 95: cooling region; 98: fixing agent; 100: semiconductor module; 120: fastening member; 130: coolant supply unit; 131: through hole; 131-1: the first through hole; 131-2: the second through hole; 131-3: the third through hole; 131-4: the fourth through hole; 131-5: the fifth through hole; 131-6: the sixth through hole; 141: inlet; 142: outlet; 143: introducing tube; 144: deriving tube; 200: vehicle; 210: control device

What is claimed is:

1. A semiconductor module comprising;
   semiconductor devices and a cooling apparatus; wherein
   the semiconductor device has semiconductor chips and a circuit board with the semiconductor chips implemented thereon;
   the cooling apparatus has;
   a top plate where the circuit board of the semiconductor device is fixed on a principal surface;
   a side wall connected to the top plate;
   a bottom plate facing the top plate, connected to the side wall;
   a coolant flow portion defined by the top plate, the side wall and the bottom plate, for distributing coolant;
   an inlet formed on the bottom plate for introducing coolant to the coolant flow portion;
   an outlet formed on the bottom plate for deriving coolant from the coolant flow portion; and
   a plurality of fins arranged in the coolant flow portion and extending for connecting between the top plate and the bottom plate;
   the top plate and the bottom plate include three through holes that are through holes for inserting fastening members that fasten the semiconductor module to an external apparatus, penetrating the top plate and the bottom plate in one direction respectively; and
   a geometric center of gravity of a aperture of at least one of the inlet and the outlet is positioned inside a virtual triangle with the three through holes being vertexes in planar view.

2. The semiconductor module according to claim 1, wherein
in planar view, two through holes of the three through holes are positioned on both sides of the aperture; and
a perpendicular bisector of a line segment connecting points positioned inside each of the two through holes passes through the aperture.

3. The semiconductor module according to claim 2, wherein
in planar view, a perpendicular bisector of a line segment connecting each geometric center of gravity of the two through holes passes through a geometric center of gravity of the aperture.

4. The semiconductor module according to claim 1, wherein
an outer edge of the aperture is positioned inside a virtual triangle with the three through holes being vertexes.

5. The semiconductor module according to claim 1, wherein
the through holes include a first through hole, a second through hole, a third through hole and a fourth through hole;
the first through hole and the fourth through hole are positioned on both sides of the inlet, and the second through hole and the third through hole are positioned on both sides of the outlet in planar view;
in planar view, when seeing from a direction orthogonal to a line connecting the first through hole and the fourth through hole, the second through hole is positioned between the first through hole and the fourth through hole;
in planar view, a geometric center of gravity of the inlet is positioned inside a virtual triangle with the first through hole, the fourth through hole and the second through hole being vertexes; and
in planar view, a geometric center of gravity of the outlet is positioned inside a virtual triangle with the second through hole, the third through hole and the fourth through hole being vertexes.

6. The semiconductor module according to claim 5, wherein
when seeing from a direction orthogonal to a straight line connecting the first through hole and the fourth through hole, at least a part of the second through hole overlaps the inlet.

7. The semiconductor module according to claim 6, wherein
when seeing from a direction orthogonal to a straight line connecting the first through hole and the fourth through hole, a geometric center of gravity of the second through hole matches a geometric center of gravity of the inlet.

8. The semiconductor module according to claim 6, wherein
when seeing from a direction orthogonal to a straight line connecting the second through hole and the third through hole, at least a part of the fourth through hole overlaps the outlet.

9. The semiconductor module according to claim 8, wherein
when seeing from a direction orthogonal to a straight line connecting the second through hole and the third through hole, a geometric center of gravity of the fourth through hole matches a geometric center of gravity of the outlet.

10. The semiconductor module according to claim 5, wherein
a line connecting the first through hole and the fourth through hole is parallel to a line connecting the third through hole and the second through hole; and
an angle formed by a line connecting the first through hole and the fourth through hole and a line connecting the second through hole and the fourth through hole is an acute angle.

11. The semiconductor module according to claim 5, wherein
the top plate and the bottom plate are rectangles in planar view;
the through holes further include a fifth through hole; and
when seeing from a direction orthogonal to a straight line connecting the first through hole and the fourth through hole, at least a part of the second through hole overlaps the fourth through hole, and at least a part of the fifth through hole overlaps the third through hole.

12. The semiconductor module according to claim 11, wherein
the through holes further include a sixth through hole; and
when seeing from a direction orthogonal to a straight line connecting the first through hole and the fourth through hole, at least a part of the sixth through hole overlaps the first through hole.

13. The semiconductor module according to claim 12, wherein
in planar view, the first through hole, the third through hole, the fifth through hole and the sixth through hole are positioned at four corners of the rectangle.

14. The semiconductor module according to claim 1, wherein
thickness of the bottom plate is thicker than a portion facing the coolant flow portion on the top plate.

15. The semiconductor module according to claim 1, wherein
at least one through hole of the three through holes penetrates the top plate, the side wall and the bottom plate in one direction.

16. The semiconductor module according to claim 15, wherein
the side wall includes a thin portion and a thick portion, and the at least one through hole is formed in the thick portion.

17. The semiconductor module according to claim 1, wherein
the cooling apparatus is positioned outside the coolant flow portion, and further has a reinforcing portion connected to the top plate and the bottom plate; and
at least one through hole of the three through holes penetrates the top plate, the reinforcing portion and the bottom plate in one direction.

18. The semiconductor module according to claim 1, wherein
the semiconductor device further has a resin structure for sealing the semiconductor chips;
the resin structure is fixed on the principal surface of the top plate; and
the through holes penetrate at least the resin structure, the top plate and the bottom plate in one direction.

19. The semiconductor module according to claim 18, wherein
when the fastening members are screws, the resin structure includes recessed portions for accommodating heads of the screws to prevent the heads of the screws from protruding outwardly of the resin structure.

20. A vehicle comprising a semiconductor module according to claim 1.

\* \* \* \* \*